(12) United States Patent
Lee et al.

(10) Patent No.: US 6,425,178 B1
(45) Date of Patent: Jul. 30, 2002

(54) CARRIER FOR A MODULE INTEGRATED CIRCUIT HANDLER

(75) Inventors: Sang Soo Lee; Wan Gu Lee, both of Choongchungnam-do; Jong Won Kim, Kyungki-do; Hee Soo Kim, Kyungki-do; Young Hak Oh, Kyungki-do; Dong Chun Lee, Seoul, all of (KR)

(73) Assignee: Mirae Corporation, Chunan-si (KR)

( * ) Notice: Subject to any disclaimer, the term of this patent is extended or adjusted under 35 U.S.C. 154(b) by 0 days.

(21) Appl. No.: 09/428,477

(22) Filed: Oct. 28, 1999

(30) Foreign Application Priority Data

| Oct. 31, 1998 | (KR) | 98-46603 |
| Oct. 31, 1998 | (KR) | 98-46604 |
| Nov. 2, 1998 | (KR) | 98-46778 |
| Nov. 4, 1998 | (KR) | 98-47191 |
| Nov. 9, 1998 | (KR) | 98-47859 |
| Nov. 9, 1998 | (KR) | 98-47860 |

(51) Int. Cl.[7] ............................................. B23P 19/00
(52) U.S. Cl. ..................... 29/759; 29/729; 29/739; 206/706; 206/707; 206/561; 211/41.17; 361/825; 220/541
(58) Field of Search ..................... 29/729, 739, 757, 29/759; 206/706, 707, 725, 561; 211/41.17; 220/4.02, 542, 544, 541; 198/867.05; 361/825

(56) References Cited

U.S. PATENT DOCUMENTS

| 2,968,398 A | * | 1/1961 | Jarvi .......................... 206/561 |
| 4,158,876 A | * | 6/1979 | Pedro .................... 206/706 X |
| 5,269,600 A | * | 12/1993 | Arreloa et al. .......... 220/542 X |
| 6,062,799 A | * | 5/2000 | Han et al. ........... 198/867.05 X |

FOREIGN PATENT DOCUMENTS

| GB | 2023102 | * 12/1979 | ................. 206/561 |

* cited by examiner

Primary Examiner—Rick K. Chang
(74) Attorney, Agent, or Firm—Fleshner & Kim, LLP

(57) ABSTRACT

A module integrated circuit (IC) carrier is used to move module ICs through a testing machine. The module IC carrier has a housing with a pair of installation elements installed parallel to one another in a receiving space of the housing. A plurality of holding members are installed on each of the installation elements. Each holding member on one of the installation elements faces a corresponding holding member on the other of the installation elements. Module ICs are held between corresponding pairs of the holding members. The holding elements can be biased towards each other to help hold the module ICs. Each holding element may include a rotator with a grooved edge which helps to hold a module IC, and which allows the module ICs to be easily inserted into and removed from the carrier.

17 Claims, 34 Drawing Sheets

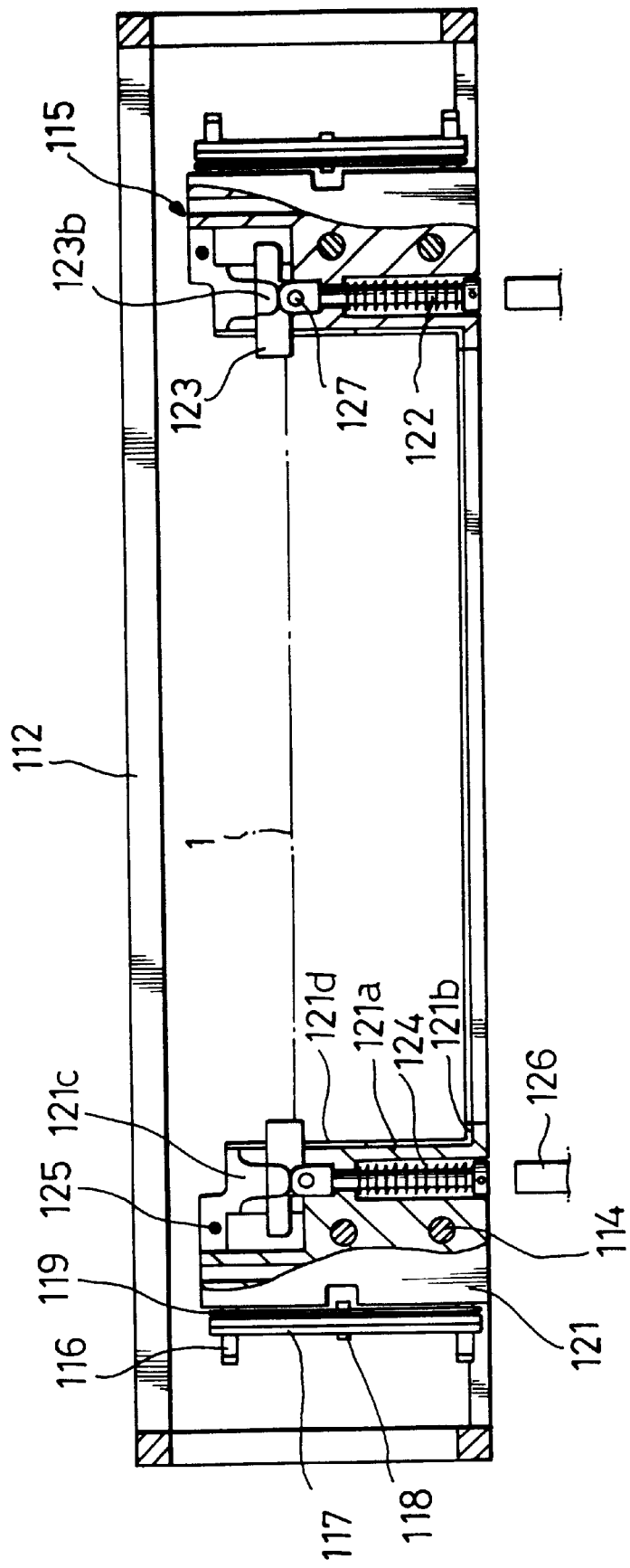

CARRIER FOR A MODULE INTEGRATED CIRCUIT HANDLER

BACKGROUND OF THE INVENTION

1. Field of the Invention

The present invention relates to a carrier for a module IC handler, and more particularly to a carrier for a module IC handler used to transfer the carrier holding a plurality of module ICs between the processes.

2. Description of the Conventional Art

Typically, a module IC 1 refers to, as shown in FIG. 1, a standalone structure provided with a substrate 2 whose one side or both sides thereof is used for fixedly mounting a plurality of ICs 1 and electric components 2, for example, by soldering, and has a function for extending a capacity when it is coupled to a mother substrate. In FIG. 1, reference numeral 1a denotes a pattern.

For the prior process for manufacturing a module IC, since there has been no an apparatus for automatically loading the module IC into a test socket, testing the same, automatically classifying into respective categories depending upon the test results and then unloading the classified modules into the customer trays (not shown), the operator manually has to pick up one piece of the module IC from the test tray in which the module ICs are contained therein, load it into a test socket, conducts the tests for a time period preset, and finally classify the module IC depending upon the test results in order to put it into the customer tray. This results in lower productivity due to manual work.

In the meantime, referring to FIGS. 1 and 2 illustrating a handler developed by the inventors, the constitution thereof will be described below.

As shown in FIG. 2, fingers 4 remain fully opened which will hold both ends of the module IC, when well-known picking-up means 3 is transferred toward a tray so as to hold one module IC contained in the tray.

When the transferring of picking-up means 3 to a tray side is completed under the state that the fingers 3 are opened, the fingers 4 are moved to a position over the module IC and then moved downward. At this time, a finger cylinder is driven to inwardly move the fingers, which in turn hold the module IC 1 in the tray.

After holding the module IC 1 contained in the tray, the picking-up means 3 is moved to a test site in which a test socket 6 is located, places the held module IC 1 on a position over the test socket 6 and then is again moved to the tray side in order to hold another new module IC.

With repetitions of the above-mentioned operations, if all the module ICs to be tested are loaded into a plurality of test sockets 6 disposed at the test site, a main cylinder 7 and a poking cylinder 8 are in turn sequentially driven to lower a pusher 9, during which the pusher 9 presses a top surface of the module IC 1 placed on the test tray 6. Thus, patterns 1a of the module IC 1 can be electrically coupled to terminals of the test socket 6. Therefore, it becomes possible to conduct the performance tests for the module IC.

In the meantime, when the tests for the module ICs are finished, a discharging cylinder 10 is driven to rotate a discharging lever 11 to pull out the module IC 1 inserted into the test socket 6, and then another picking-up means disposed at an unloading side holds the test-finished module IC 1 to unload it into a customer tray depending upon the test results.

However, because the module IC 1 is transferred to the test socket 6 by the conventional picking-up means, the following problems occur.

Firstly, since the picking-up means designed to hold the module IC and load/unload it into/from the test socket cannot be used to handle the module IC in a sealed chamber, there is a problem that the module IC is tested at a normal temperature. However, because the module IC is actually driven at a higher temperature, there occurs a difference between conditions at the test and at an actual use of the IC, thus resulting in lower reliability of the product discharged.

Secondly, since the module ICs in the tray and in the test socket are held and transferred by the picking-up means, the transfer of the module IC cannot be made during the tests. An elongated cycle time is introduced, by which lots of module ICs cannot be tested during a time interval given.

SUMMARY OF THE INVENTION

Therefore, it is an object of the present invention to provide a carrier for a module IC handler being capable improving reliability of the discharged product by conducting performance tests at a constant temperature for the module IC manufactured.

It is another object of the present invention to a carrier for a module IC handler being capable maximizing availability of a high-cost apparatus by using picking-up means which performs only the loading/unloading of module ICs contained in a tray into/from a carrier, and by transferring the carrier holding a plurality of module ICs therein between the processes.

To accomplish the above objects, a carrier for a module IC handler according to the present invention is provided, the carrier comprising: a housing; a pair of installation elements installed parallel to each other in a receiving space of the housing, and having a guide groove; a plurality of rotators elastically installed in the installation elements, and for supporting the module IC by retractable actions thereof; and an elastic member giving a restoring force to the rotator.

To accomplish another object of the present invention, a carrier for a module IC handler according to the present invention is provided, the carrier comprising: a housing; a pair of guides disposed at both sides of the housing; a plurality of supporting members installed between the guides, and to which the module IC is seated by inserting both ends of the module IC thereto; a pressing member installed at a predetermined place of the supporting member, for pressing a top of the module IC loaded into the supporting member; and opening/closing means for opening/closing a seating groove formed in the supporting member, when the module IC is loaded or unloaded.

BRIEF DESCRIPTION OF THE DRAWINGS

FIG. 30b is a view showing the state that by the descending operation of the pusher, the pressing piece holds the module IC inserted into an insertion groove of a housing.

DETAILED DESCRIPTION OF THE INVENTION

Referring to the accompanying drawings, a carrier for a module IC handler according to various embodiments of the present invention will be described in detail.

At first, a carrier for a module IC handler according to a first embodiment of the present invention will be explained below, with reference to FIG. 7.

Figure 1:
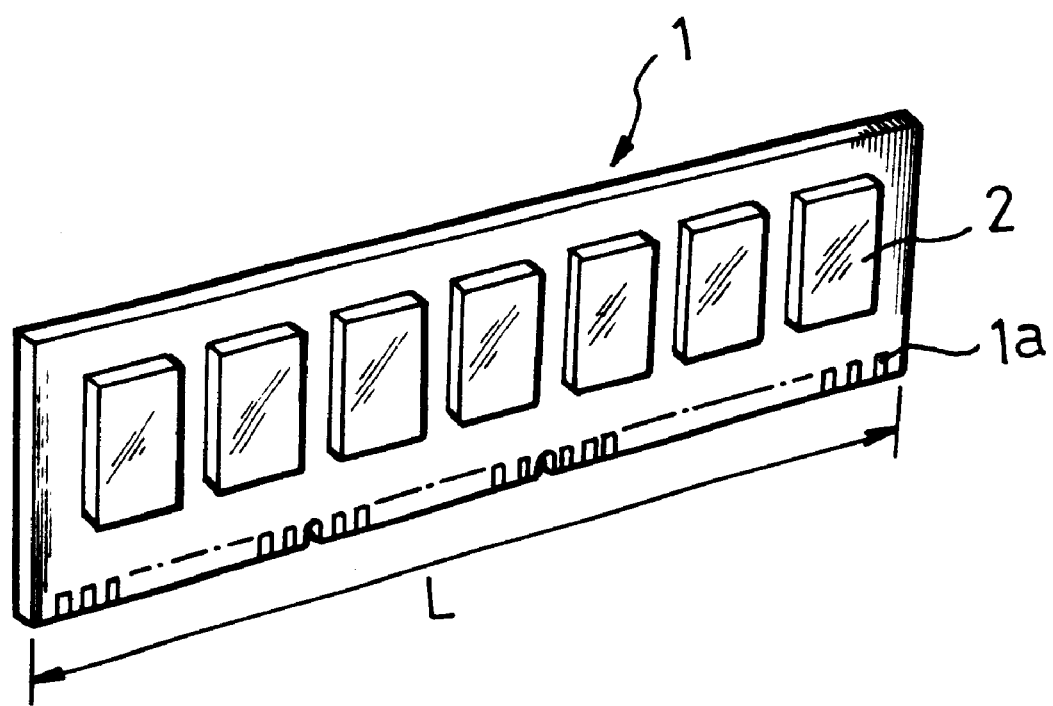
FIG. 1 is a perspective view of a conventional module IC.
Figure 2:
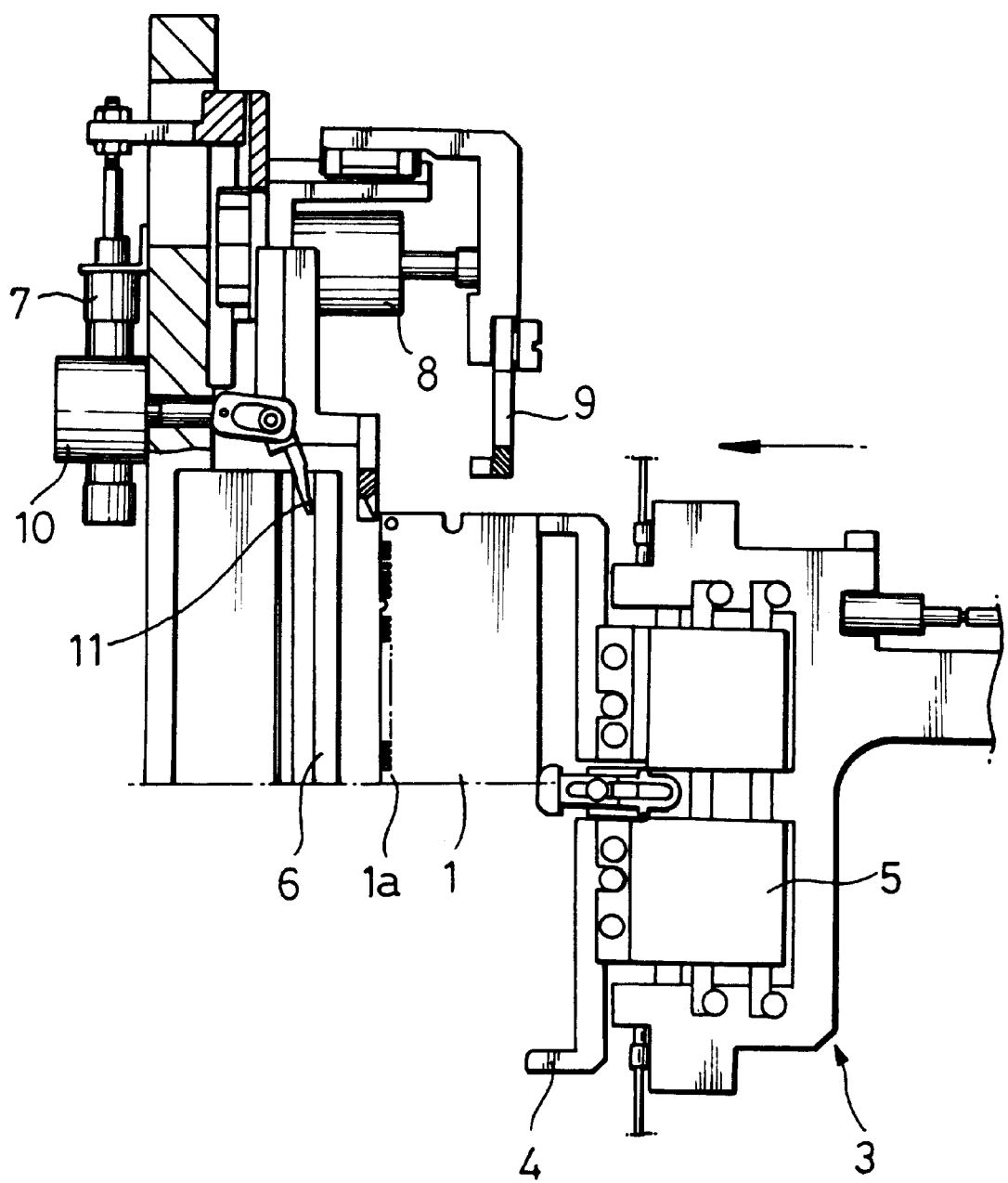
FIG. 2 illustrates the state that, for the conventional module IC handler, a module IC picking-up means holds the module IC to load it in a test socket of a test site.
Figure 3:
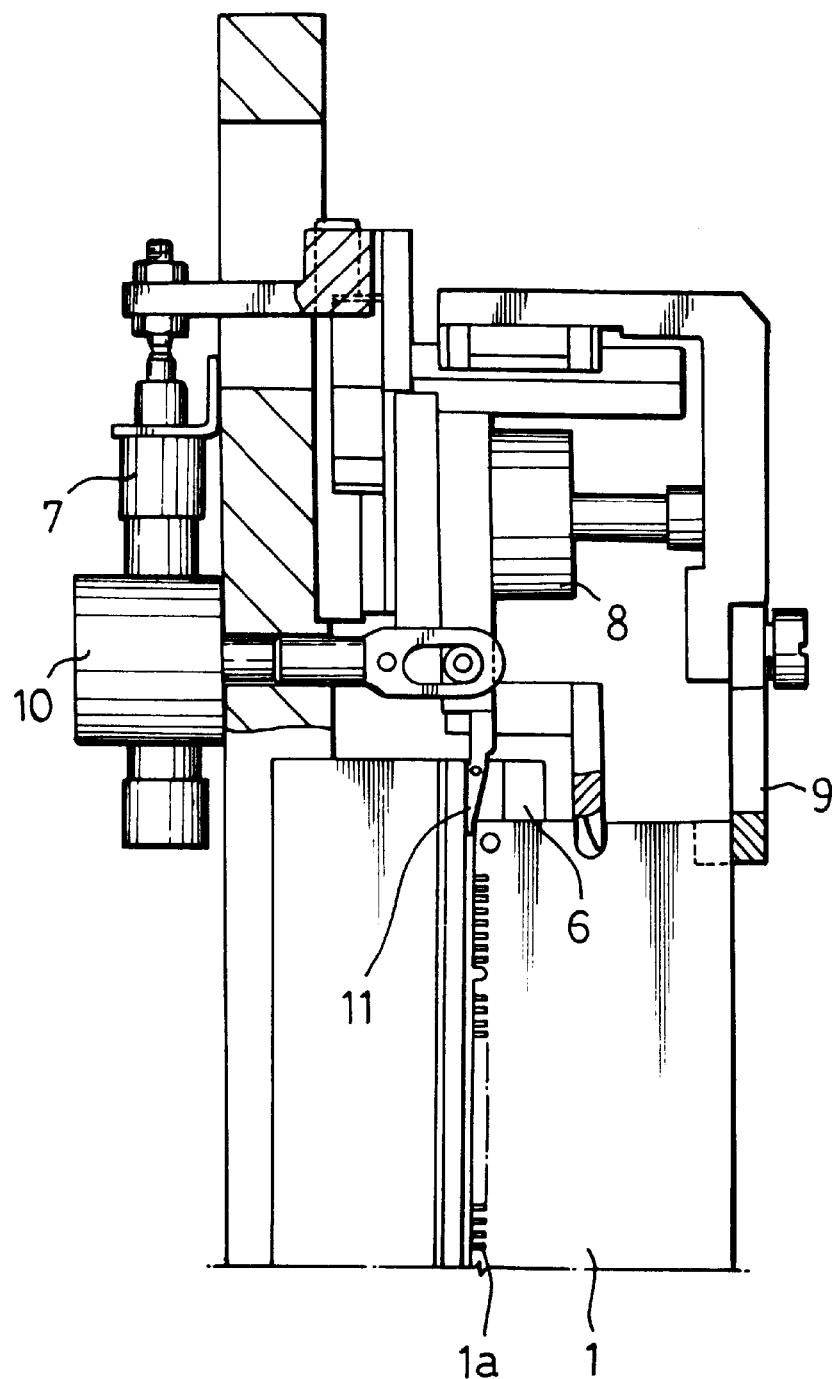
FIG. 3 illustrates the state that, the conventional module IC handler, the insertion of the module IC into the test socket is completed.
Figure 4:
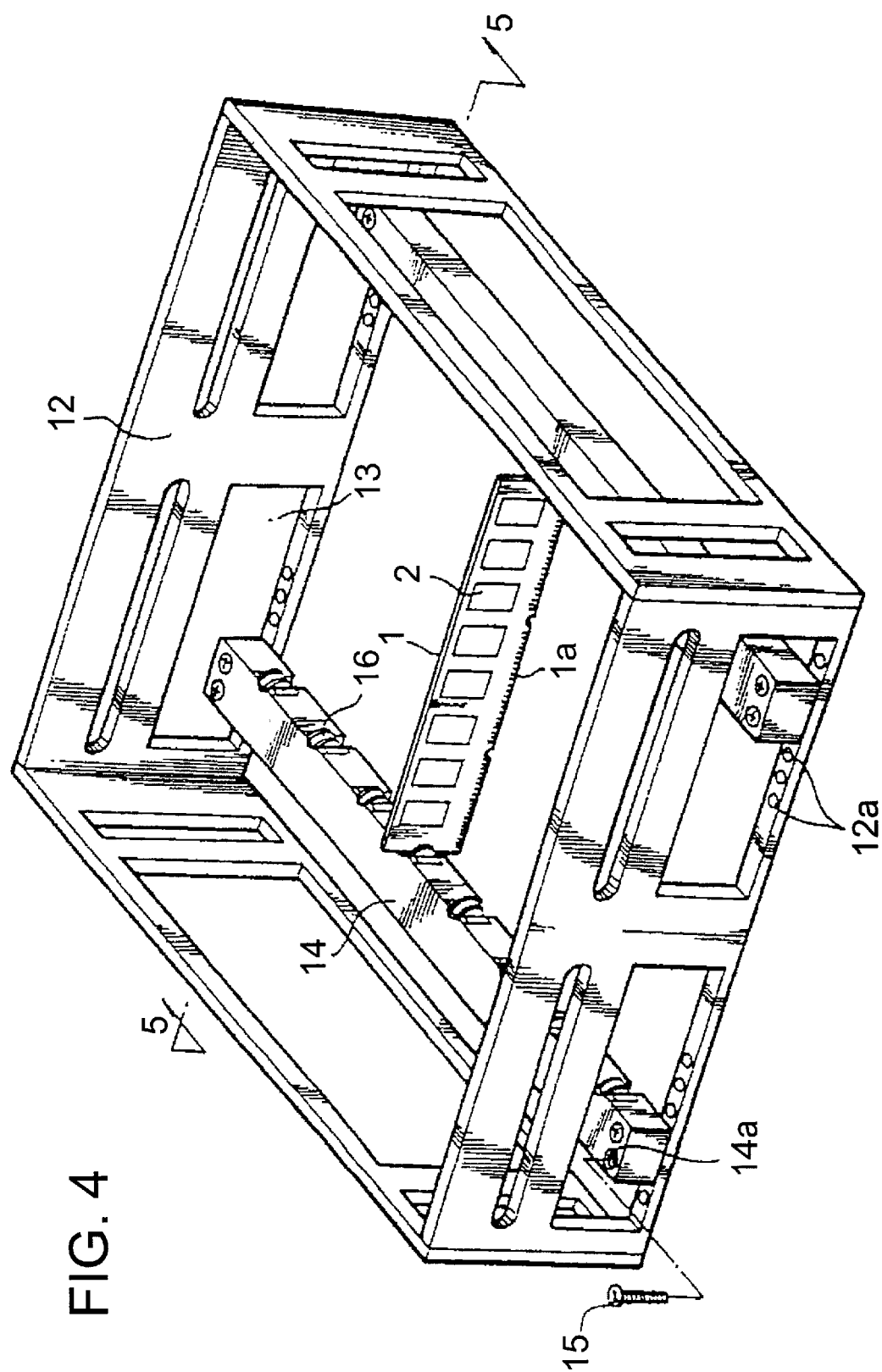
FIG. 4 illustrates a carrier for a module IC handler according to a first embodiment of the present invention.
Figure 5:
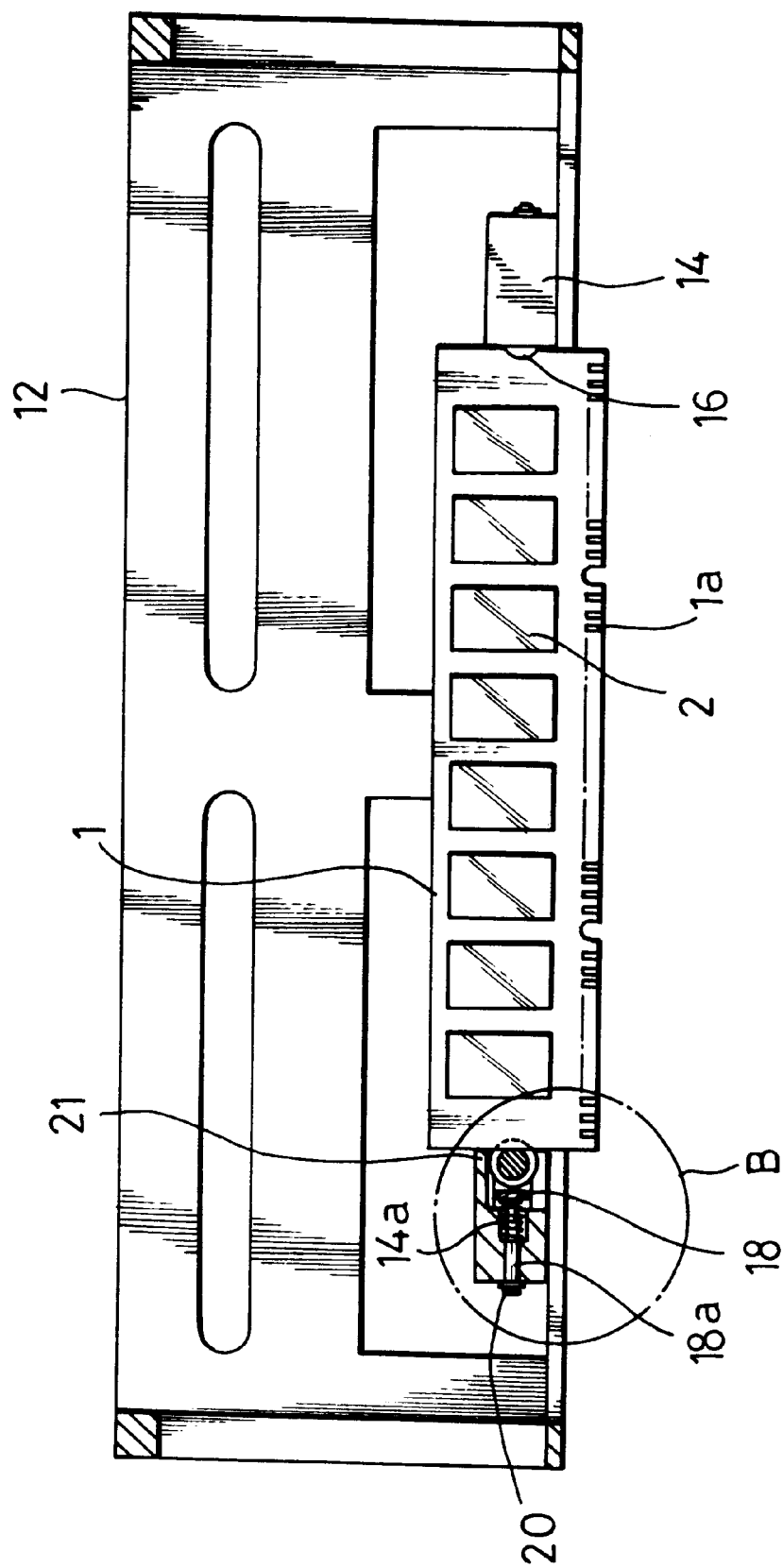
FIG. 5 is a sectional view taken along line A—A in FIG. 4.
Figure 6:
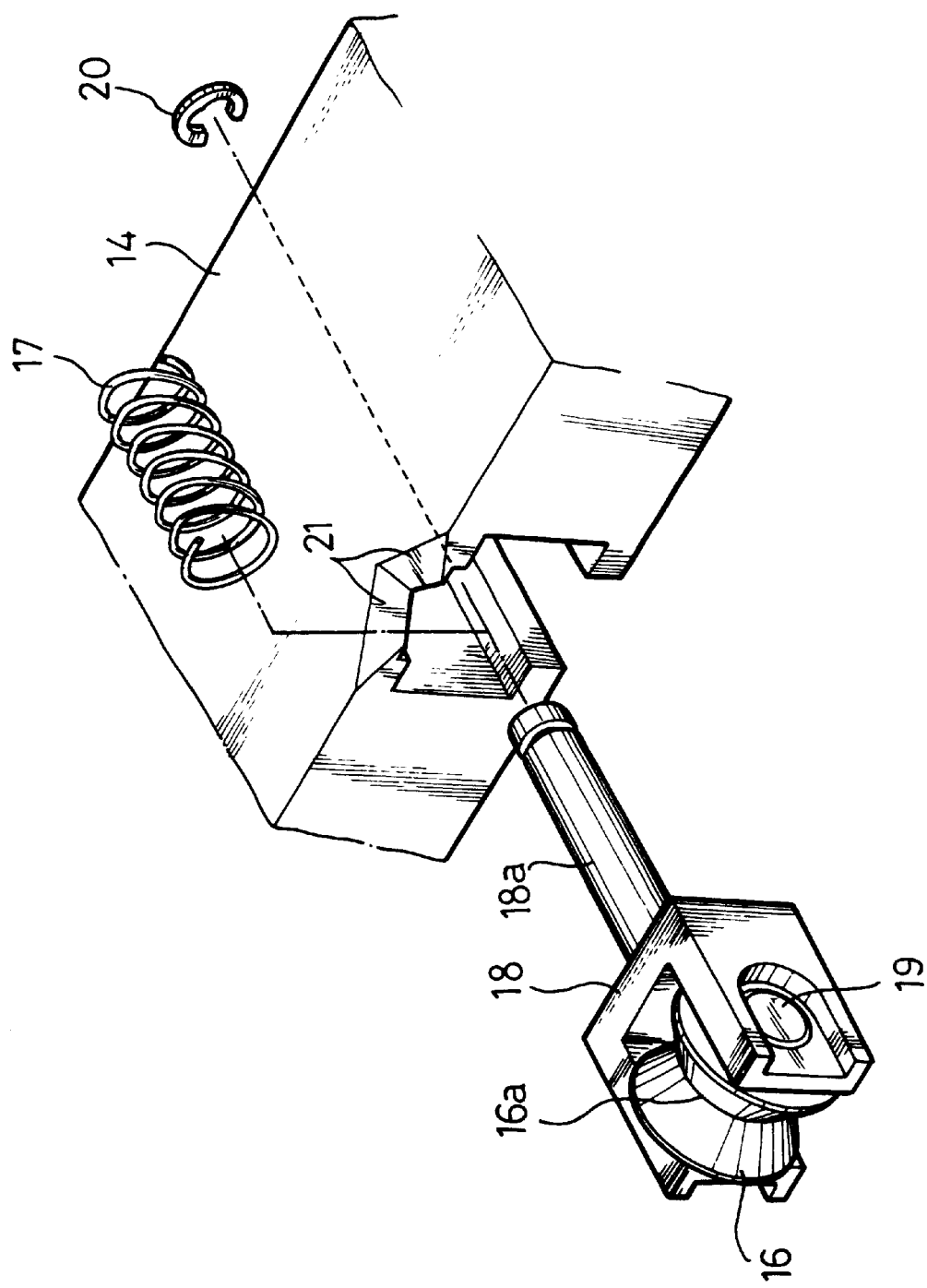
FIG. 6 is an exploded perspective view of the portion "B" in FIG. 5.

The carrier for the module IC handler, as shown in FIGS. 4 to 6, is provided with a pair of installation elements 14 each element being spaced apart at an equidistance therebetween, wherein the parallel elements 14 are disposed in a receiving space 13 of a housing 12 configured like a rectangular frame. Further, the housing 12 has a plurality of fastening holes 12a formed at both right and left sides thereof, and to which fixing screws 15 are selectively screwed through the through-holes 14a formed in the installation elements 14, so that a spacing between the installation elements 14 may be adjusted depending on a longitudinal width L of the module IC 1. Thus, a single one carrier can cover the handling of various kinds of module ICs each having different size.

A plurality of rotators 16 elastically provided, respectively, in the installation elements 14 are used to support both ends of the module ICs 1, which each rotator is retractable by the aid of an elastic member 17.

Figure 7:
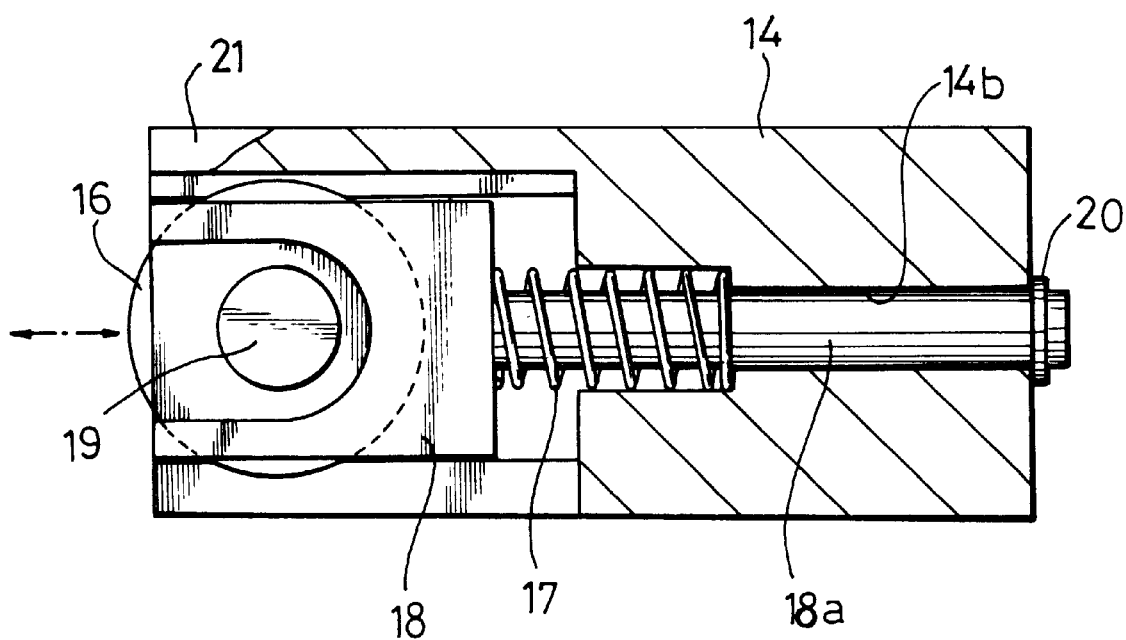
FIG. 7 is a vertical sectional view showing the combining state of FIG. 6.

To endow the rotator 16 with a retractable function in the installation element 14, as shown in FIGS. 6 and 7, the rotator 16 is axially coupled to a bracket 18 having a protrusion rod 18a into which the elastic member 17 is inserted and which is coupled to an insertion hole 14b of the installation element 14. The rod 18a also has an end portion to which an E-ring 20 is coupled to support the rod.

Each rotator 16 is provided with a V-groove 16a formed along a circumferential surface thereof, like a configuration of V-belt pulley. The installation element 14 also has a guide groove 21 immediately below which the rotator is disposed.

The V-shaped circumferential surface of the rotator 16 is provided for safely maintaining the module ICs inserted between the rotators, without the module IC being floated left and right, during the transferring of the carrier. Moreover, The provision of the guide groove 21 in the installation element 14 accurately places the module IC 1 into the V-groove 16a of the rotator.

The operation of a first embodiment of the present invention will be described.

Referring to FIG. 5, the bracket 18 is fully, forwardly projected from the installation element 14 by the elastic member 17, when the module IC is not yet loaded between the rotators 16 provided in the respective installation elements 14. Therefore, under such a condition, a distance S between the rotators is narrower than the longitudinal width L of the module IC. After the conventional picking-up means hold the plural module ICs 1 from the tray and then transfer them to position over the carrier, the module ICs 1 are moved downward from the position determined by the guide groove 21 formed at the installation element 14.

With the positioning of the module IC held by the picking-up means determined, when the module IC is moved downward toward the rotator 16, the bottom surface of the module IC 1 meets an inner surface of the V groove 16a, due to wider width L of the module IC 1 than the distance S between the opposing rotators 16. As the descending operation of the module IC 1 held by the picking-up means continues, the rotators 16, which is coupled to the bracket 18 to be rotated, then respectively rotate and are retracted backward to thereby compress the elastic member 17.

As described above, the rotators 16 retracted backward by both ends of the module IC 1 firmly support both ends of the module ICs by a restoring force of the elastic member 17 which tends to return to its initial state.

When the picking-up means holding the module IC 1 reaches its associated bottom dead point, the holding state for the module IC 1 is released, and then the picking-up means is again elevated. At this time, the module ICs 1 both ends of which are supported by the respective rotators 16 maintains their loaded state between the rotators 16 by the aid of the restoring force of the elastic member 17.

After the module IC meets the V grooves of the rotators and is loaded therein by the picking-up means, separate transferring means moves the carrier to the inside of the sealed chamber (not shown) in which the module ICs are heated at a temperature suitably selected for the tests and the tests for the module ICs are conduced.

In the meantime, after the tests are finished and then the carrier arrives at an unloading side for the module ICs, another picking-up means disposed at the unloading side lowers to hold the module IC 1 supported between the rotators 16.

When said another picking-up means holding the module IC lifts, the rotator 16 rotates by a frictional force between the rotator and the module IC, thereby minimizing the frictional resistance at their contact surface. With the continued ascending operation of the picking-up means, the module IC 1 exits from the rotators, at this time, the bracket coupled to the rotators in turn returns to its initial state by the restoring force of the elastic member 17, as shown in FIG. 5. Therefore, at the loading side, it is possible to load a new module IC into the carrier.

Although the module ICs to be tested have different longitudinal widths L, respectively, the carrier for the module IC handler according to the present invention makes it possible the adjustment of the corresponding width suitable for loading the module IC in the housing. Accordingly, the handling of various kinds of the module ICs is made possible only by one carrier. In other words, depending upon the longitudinal widths L of the module IC to be tested, the distance between the pair of installation elements 14 is defined by appropriately selecting suitable pair among the fastening holes pairs 12*a*, aligning the selected pair with the through-holes 14*a*, and fastening the fixing screw 15 thereto.

Next, a second embodiment according to the present invention will be explained below.

According to the second embodiment of the present invention, a carrier for a module IC handler, as shown in FIGS. 8 to 11, comprises a housing 32 configured like a rectangular frame, having two sides to which a pair of opposing guiders 33, 34 are disposed. Between the guiders 33(34), there is provided a pressing member 36 for opening/closing a module seating groove 35*a* which is formed on a plurality of supporting members 35 and which both ends of the module IC are inserted into and seated therein, the pressing member 36 opening or closing the module seating groove 35*a* by changing the position thereof by opening/closing means.

The opening/closing means for changing the position of the pressing member 36 when the module is loaded or unloaded may consist of:

the pair of guiders 33, 34 provided, respectively, in both right and left sides of the housing 32, each guider being disposed oppositely to each other and having an inner surface looking at each other on which a cam surface 33*a*(34*a*) is formed, and an outer surface on which a hitching jaw 33*b*(34*b*) is formed;

guide bar 37(38) outwardly projected from both ends of the pressing member 36 and having one side thereof positioned at the cam surface 33*a*(34*a*) of the guider and the other side thereof positioned at the hitching jaw 33*b*(34*b*);

a pair of connection bars 39 crossing both the guide bars 37, 38, consisting of the guide bar 37 fixed at an inner side and positioned therebetween and another guide bar 38 fixed at an outer side and positioned below the bars, the connection bars 39 functioning to rotate the pressing member 36 during elevation thereof;

an opener 41 fixed at both ends of the connection bar 39, and which ascends or descends by a pusher 40;

a guide rod 42 for guiding the ascending or descending motion of the opener 41; and an elastic member 43 for restoring the opener 41 when external force is not applied thereto.

When the pressing members 36 rotate in opposing directions to each other by the pressing operation of the opener 41, the module seating groove 35*a* of the supporting member 35 is opened and the known picking-up means can thus load the module IC to be tested into the module seating groove 35*a* of the supporting member 35, or unload the test-finished module IC 1.

Figure 10:
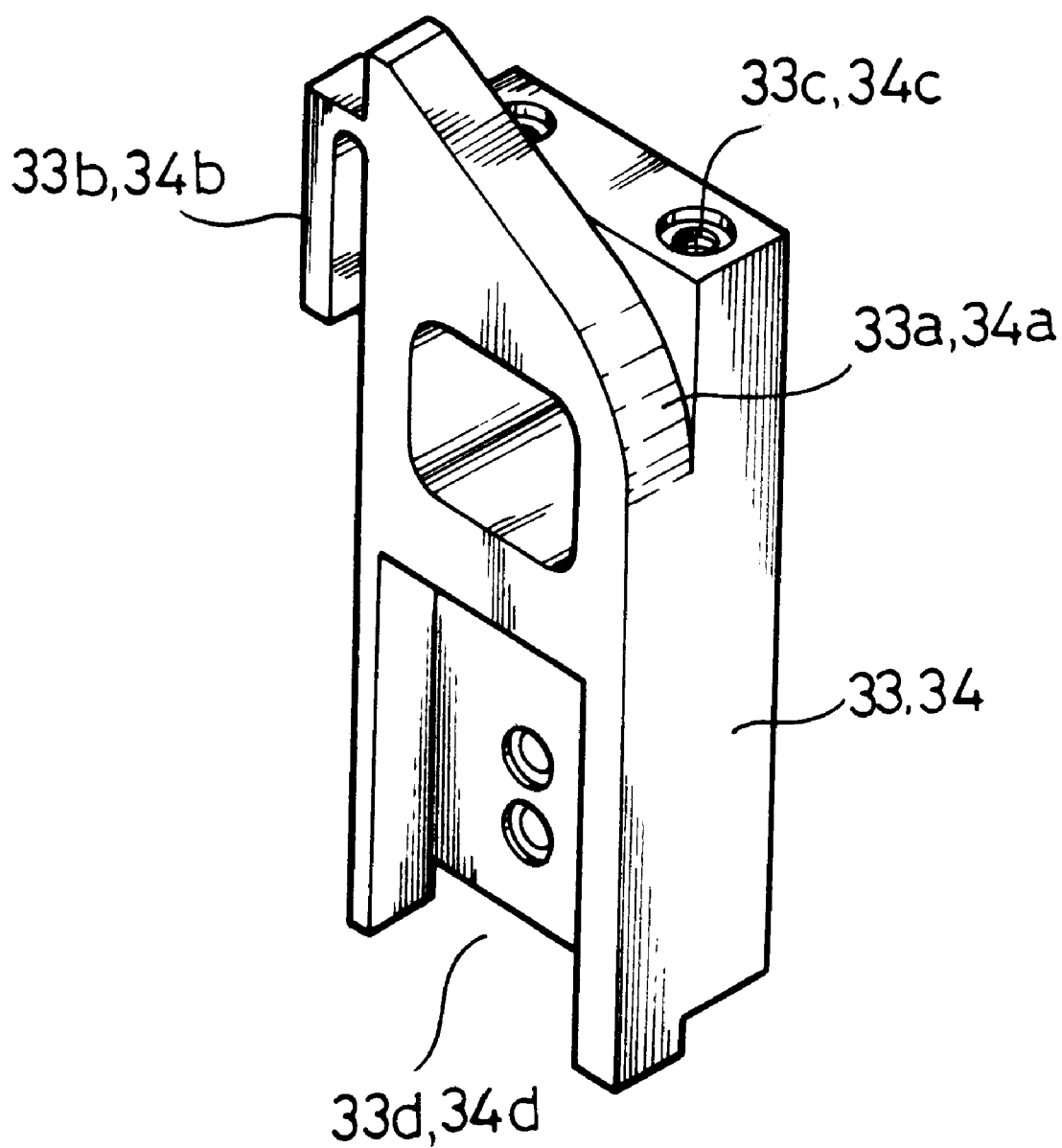
FIG. 10 is a perspective view of a guider.
Figure 11:
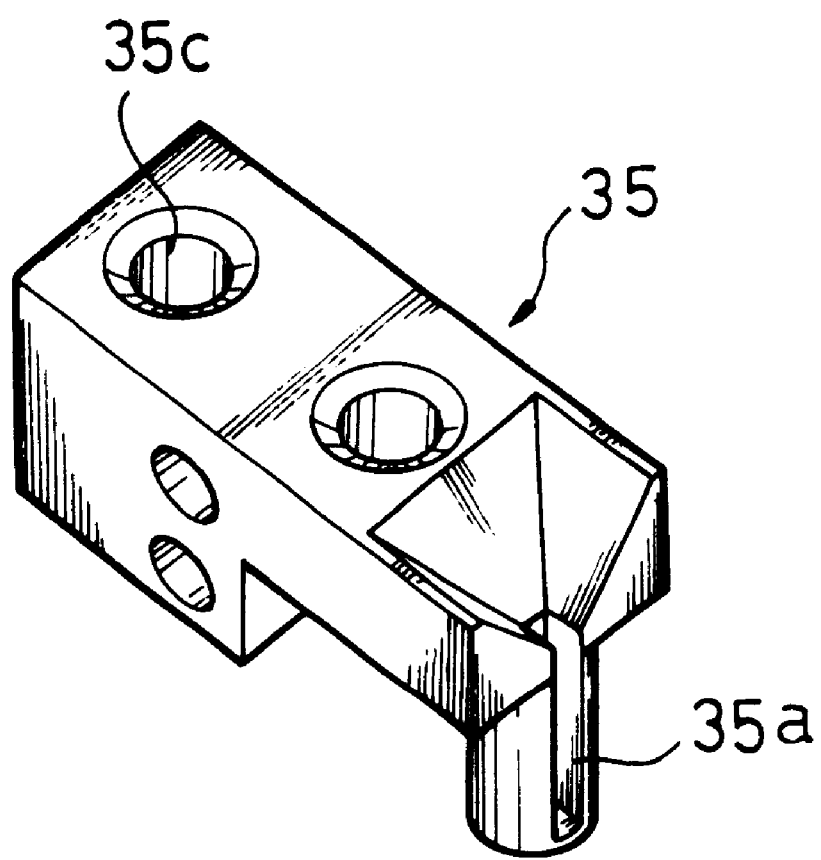
FIG. 11 is a perspective view of a supporting member

FIG. 10 illustrates the details of the guiders 33, 34 of the opening/closing means. The above structure of the opening/closing means is not limited thereto, but modifications thereof will be possible which fall within a scope of the present invention. Namely, alternatively, the module seating groove 35*a* of the supporting member 35 can be also opened, by installing the pressing member 36 in the guiders 33, 34 such that the member 36 is horizontally moved so that the pressing member 36 can be slid right or left by the pusher (not shown) having a slant surface, at the loading or unloading of the module ICs. However, in this case, inconvenience may occur that the pressing member 36 should be exchanged whenever the module IC having different size in height is to be tested.

The housing 32 has further a plurality of guider fixing holes 32*a* used for fixing the guiders which have fastening holes 33*c*, 34*c*. The guiders 33, 34 are fixed by the fixing screw 34 through the guider fixing holes 32*a*, after the arrangement position of the guiders 33, 34 is determined depending on the longitudinal width L of the module IC to be tested. In other words, in the case where the short width L of the module IC to be tested is given, the narrowed spacing between two guides 33, 34 is used, whereas in case of longer width L of the IC, the wider spacing is used. Therefore, any lengths of the module IC can be adopted in the use of a single one carrier, thus it is possible to handle various lengths of the module ICs.

Although the supporting members 35 for holding the module ICs may be installed such that the spacing between the guiders 33 and 34 is not adjusted, it is desirable to employ spacing adjustment means for the supporting member 35 so that the spacing of the supporting member 35 can be adjusted in accordance with the spacing of the test socket. To this end, according to the second embodiment of the present invention, there is provided the receiving spaces 33*d*, 34*d* formed by a bottom surface in which a plurality of locking pins 45*a* are formed at an equidistance therebetween, and by a side surface in which a locking member 45 having a vertical long hole 45b formed therein is installed to be elevated or lowered by the elastic member 46. To a pair of horizontal guide rod 47, ends of which is fixed at the guides 33, 34 through the vertical long hold 45b of the locking member 45, is coupled a plurality of supporting members 35 for maintaining a constant interval, by inserting the locking pins 45a formed at a bottom surface of the locking member 45 into an insertion hole 35c.

At the state in which external force is not applied to the opener 41, since the top surface of the locking member 45 is configured such that the pressing member 36 is connected thereto by the restoring force supplied from the elastic member 43, one side of the pressing member closes the module seating groove 35a.

Figure 13A:
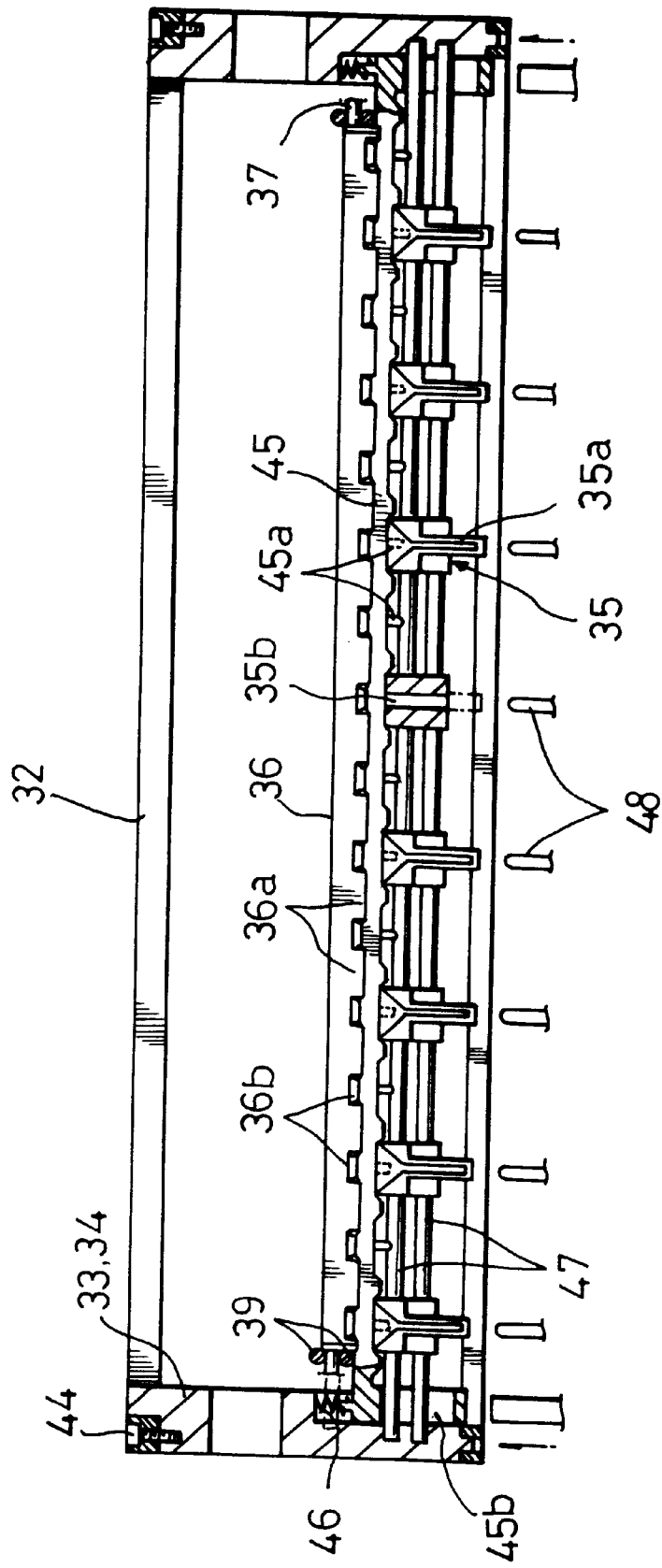
FIG. 13a is a view showing the state that a locking pin of the locking member is inserted into an insertion hole of the supporting member.
Figure 13B:
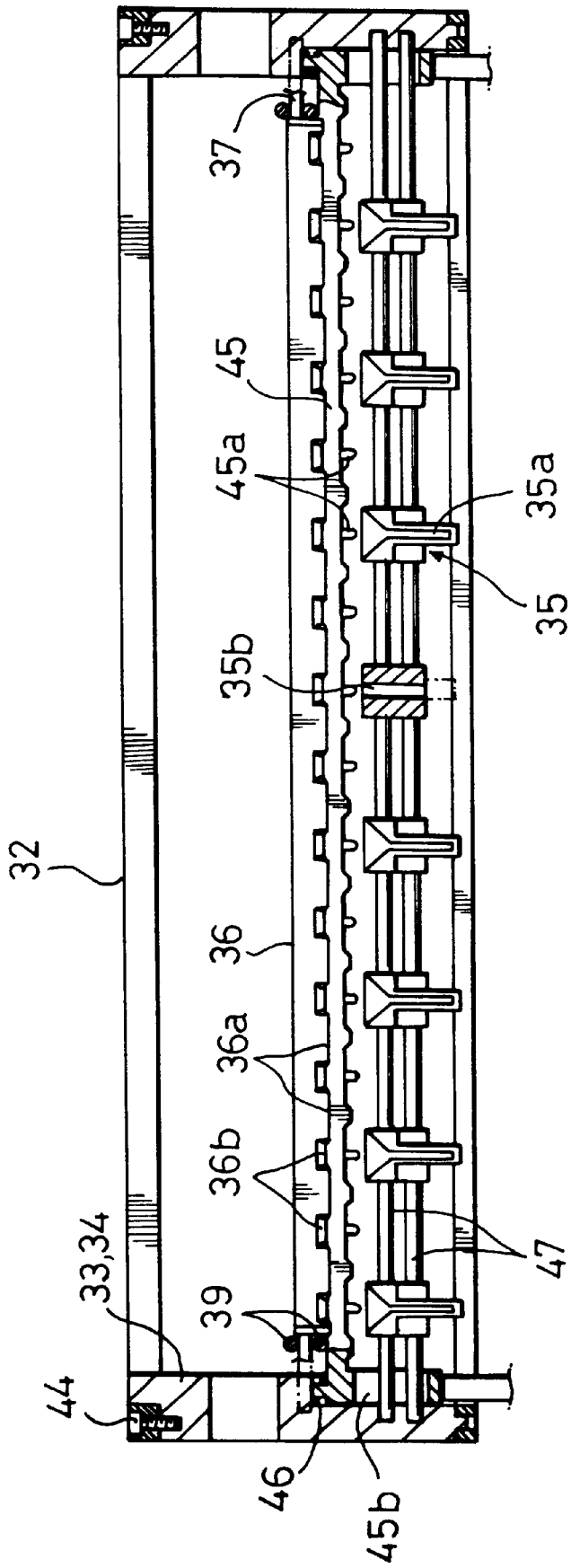
FIG. 13b is a view showing the state that the locking member is elevated to adjust a spacing between the supporting members.

As shown in FIGS. 7 and 13b, the supporting member 35 has a positioning hole 35a formed at the bottom surface thereof and the insertion hole formed at the top surface thereof. Further, an extension portion 36a of the pressing member 36, which is an upper part of the module seating groove 35a formed in the supporting member 35, has a floating preventing groove 36b for preventing the held module IC 1 from being floated during the transferring thereof between the processes. Immediately before the module IC held in the carrier is inserted into the test socket, to the positioning hole 36b is inserted extra positioning pin 48 to re-position the test socket with respect to the position of the supporting member 35, which thereby allows the module IC held in the supporting member 35 to be accurately inserted into the test socket.

The operation of the carrier for the module IC handler according to the second embodiment of the present invention will be explained below.

Under the state that the housing 32 is horizontally maintained, the extension portion 36 closes the module seating groove 35a of the supporting member 35, when the carrier is transferred by separate transferring means (not shown) to the loading side for loading the module IC 1 to be tested, the pusher 40 elevates upward from the bottom surface of the housing 32 and pushes the opener 41. Then, the opener 41 inserted into the guide rod 42 starts to compress the elastic member 43 during the elevation.

The elevation of the opener 41 introduces an elevation of the pressing member 36 due to the construction that the opener 41 is connected to the connection bar 39 into which in turn the guide bars 37, 38 fixed to the pressing member 36 is inserted.

However, since among the guide bars 37, 38 fixed to the pressing member 36, the guide bar 37 fixed in an inner side is inserted between the connection bars 39, and the guide bar 37 fixed an outer side abuts against the bottom surface of the connection bar 39 positioned at a lower side, the guide bars 37, 38 at the condition that the guide bars 37, 38 are connected to both sides of the guides 33, 34 ascend, as the opener 41 elevates.

During the elevation of the guide bars 37, 38, when the connection bar 39 continues to ascend under the condition that one guide bar 38 stops to elevate by the hitching jaw 33b, 34b formed at the guiders 33, 34, the guide bar 37 fixed at the extension portion 36a moves along the cam surface of the guiders 33, 35. Therefore, the pressing members 36 rotate in opposing directions to each other, which opens the module seating groove 35a of the supporting member 35.

By the operation described above, if the module seating groove 35a is opened, the prior pricking-up means holds the plurality of the module ICs contained in the tray to load them into the module seating groove 35a of the supporting member 35.

Figure 12:
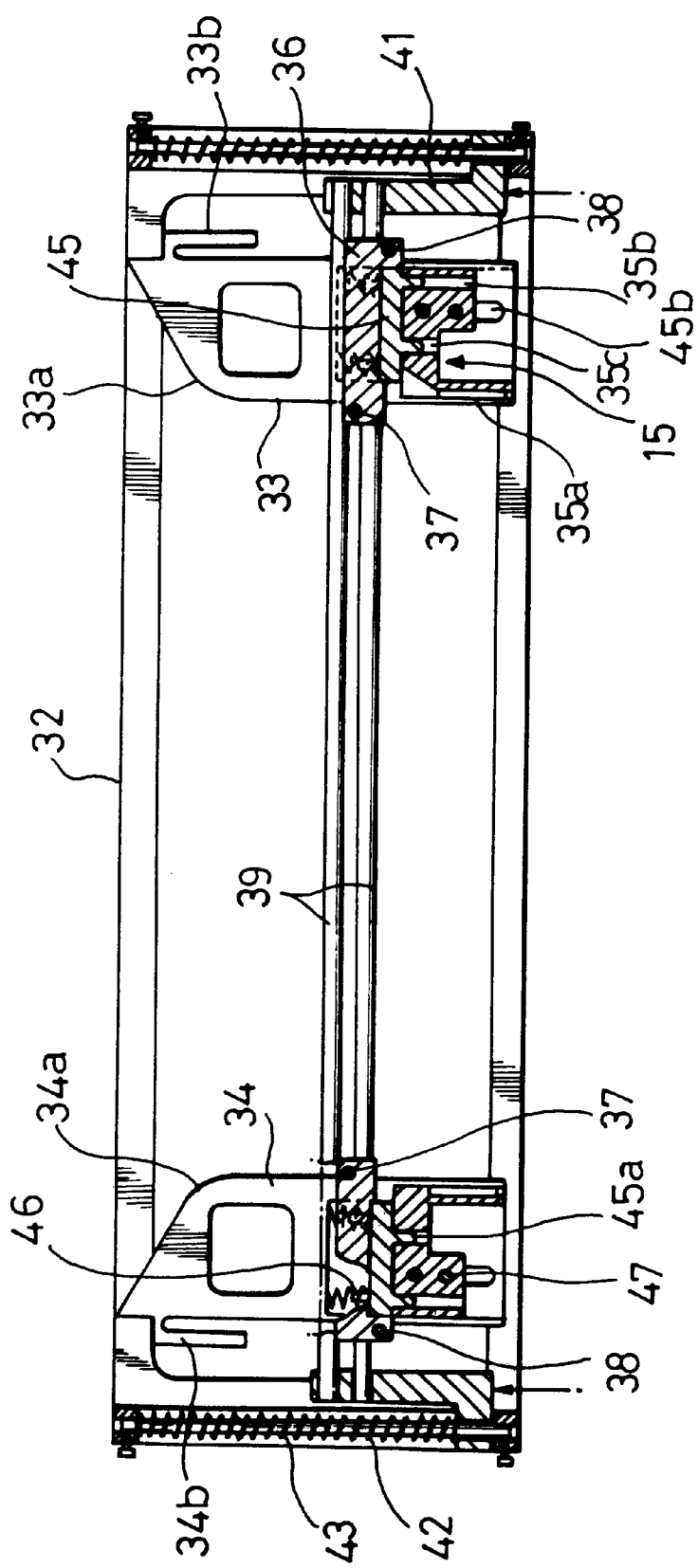
FIG. 12 is a view showing the state that a pressing member closely comes into contact with a locking member to thereby close a seating groove of the supporting member.

After the module ICs held by the picking-up means are loaded into the module seating groove 35a of the supporting member 35, the pressing member 36 returns to its initial state, as shown in FIG. 12, which operation is needed for the module IC seated in the module seating groove 35a not to be dropped from the supporting member 35 during the transferring of the carrier between the processes.

The pusher 40 having been used to elevate the opener 41 lowers by a restoring force of the elastic member 43, and the connection bar 39 fixed to the opener 41 also descends, accordingly.

With the descending operation of the connection bar 39, the pressing member 36, which was elevated and rotated by the connection bar 39, is also lowered and returns to a horizontal state thereof, which the returning to an initial state of the pressing member 36 is possible by the connection bar 39 pressing the guide bar 37.

If the pressing member 36 returns to its initial state, the top surface of the module IC inserted into the supporting member 35 is pressed by the extension portion 36a formed in the pressing member 36 and having the floating preventing groove 36b into which each the module IC seated in the module seating groove 15a is in turn inserted and thereby the module ICs are not floated during the transferring between the processes.

Figure 8:
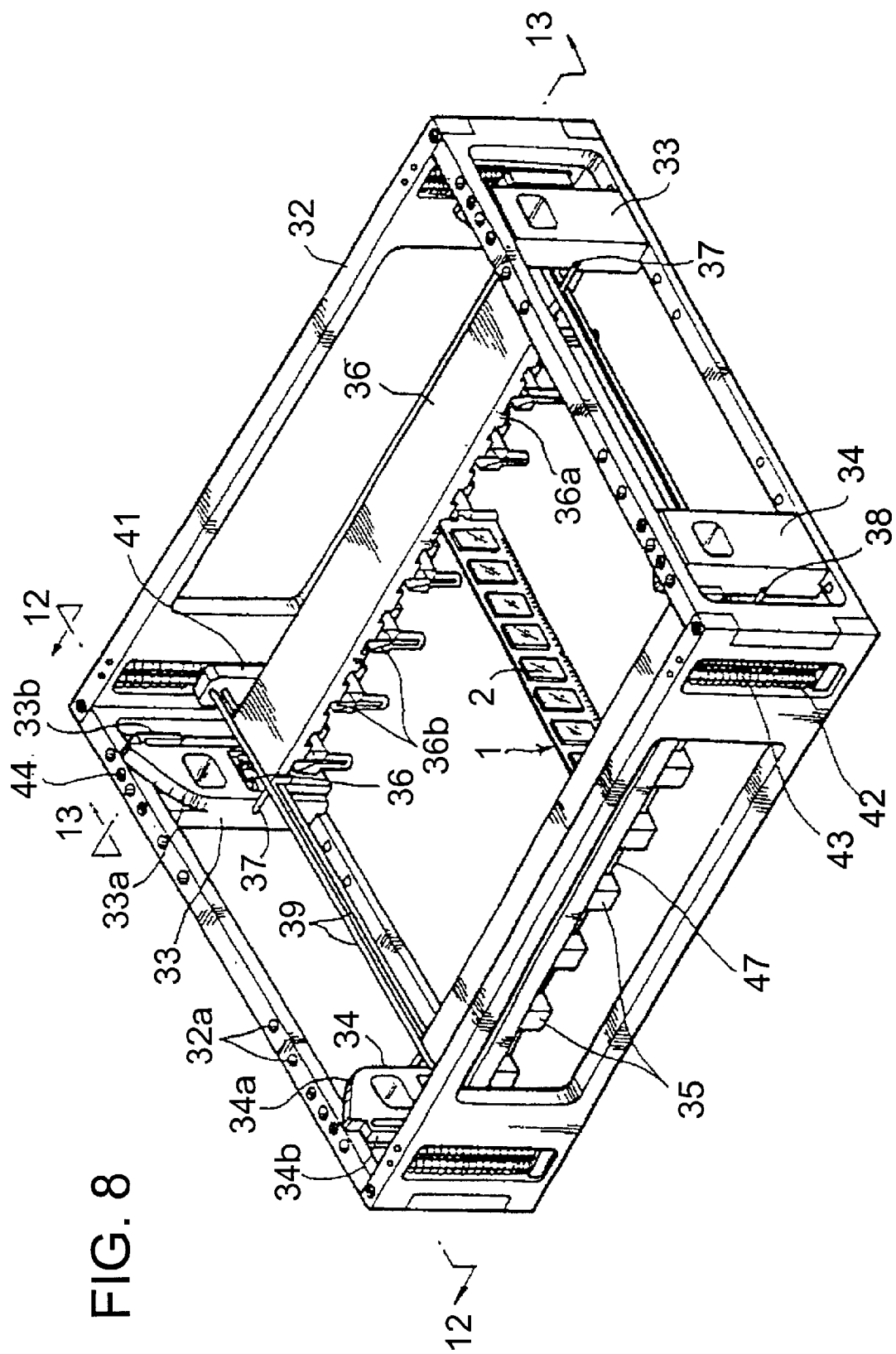
FIG. 8 illustrates a carrier for a module IC handler according to a second embodiment of the present invention.
Figure 9:
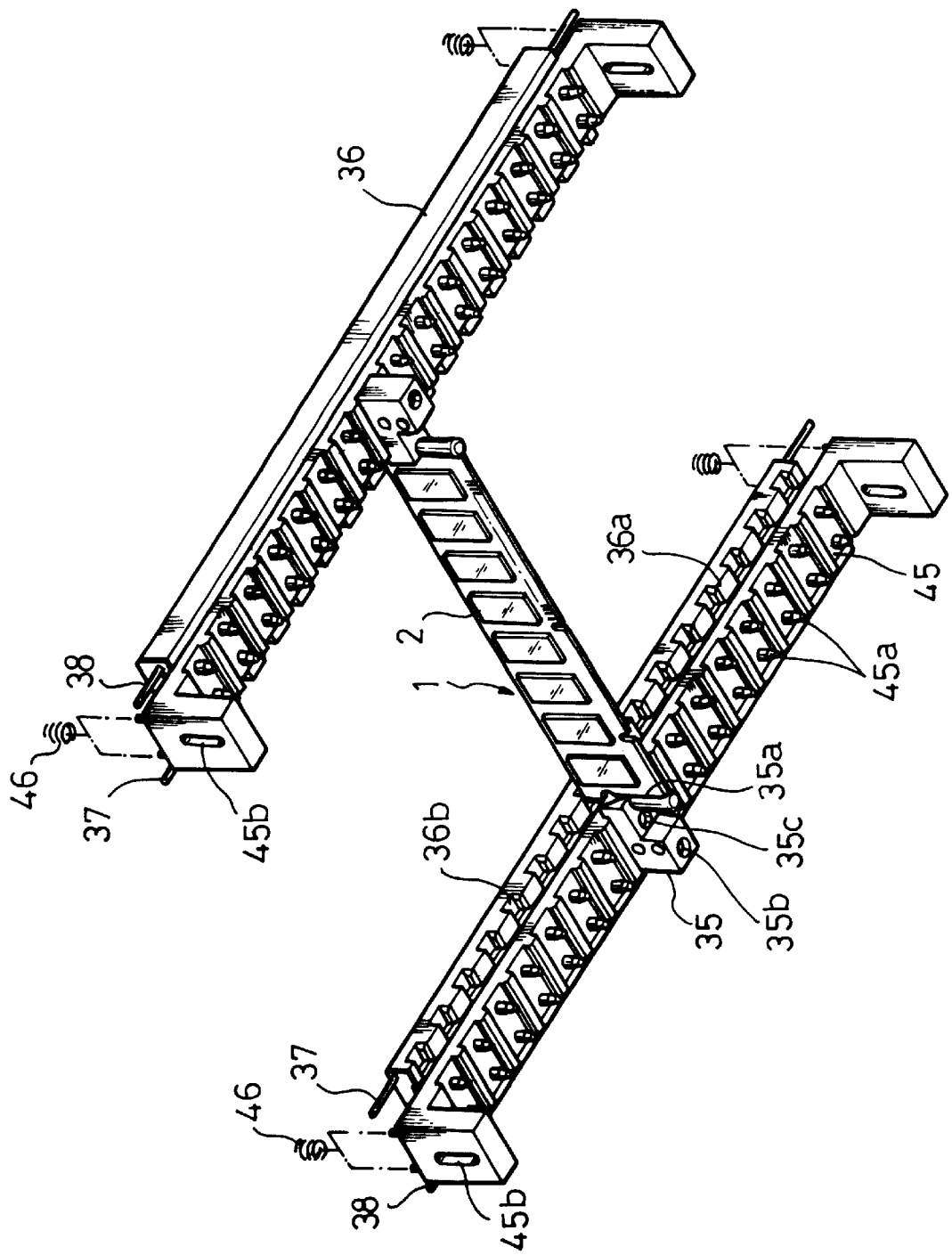
FIG. 9 is a bottom perspective view of the state that the module IC is inserted into a supporting member.

FIGS. 13a and 13b are sectional views taken along line B—B in FIG. 8. Referring to these drawings, the operation for adjusting the spacing of the supporting member 35 supported to the locking member 45, the adjustment being based on the spacing of the test socket installed at the test site, will be explained below.

At the state that external force is not applied to the locking member 45 as shown in FIG. 13a, a force applied from the elastic member 46 to the locking member will move downward the locking member, and therefore the condition is maintained that the locking pin 45a formed in the locking member is inserted to the insertion hole formed in the supporting member 35. Thus, the position of the supporting member 35 remains unchanged.

In order to adjust the spacing of the supporting member 35 as required, the locking pin 45a formed at the bottom surface of the locking member 45 exits from the insertion hole 35c of the supporting member 35, which enables the adjustment of the spacing by horizontally moving the supporting member 35 inserted to the horizontal guide rod 47.

While the locking member 45 elevates up to a constant vertical position during which the locking member 45 compresses the elastic member 26, the position of the supporting member 35 inserted to the guide rod 47 remains unchanged and the locking pin 45a can completely exit from the insertion hole 35c of the supporting member 35, whereby such an adjustment is possible. The portions of the supporting member 35 is changed by the equidistance to adjust the spacing such that the insertion hole 35c is aligned with the locking pin 25a. At this time, by the removal of the external force applied to the locking member 45, the locking member 45 returns to an initial state thereof by the restoring force of the elastic member 46, and, as shown in FIG. 13a, each of the locking pins 45a formed in the bottom surface is inserted into the insertion hole 35c. In consequence, the position of the supporting member 35 is unchanged. Thus, although the installation spacings for the test socket are varied, the module IC 1 can be handled without exchanging the carrier.

Moreover, in case the module IC having a different size in length is to be tested instead of testing the module IC of a constant length, the tests can be conducted by changing the position of the guides 33, 34 having been fixed to the housing 32 through the fixing screw 44, based upon the length of the module IC. In case of the module IC having a different size in height T, the position of the pressing member 36 pressing the top surface of the module IC is automatically varied to compensate with respect to the height, thus allowing the handling of the various sized module ICs.

Next, a third embodiment according to the present invention will be described below, with reference to FIGS. 14 to 21.

The carrier for the module IC handler according to the third embodiment of the present invention is provided with a pair of installation elements 53 in a housing 52, each element being spaced apart at an equidistance therebetween, and having insertion grooves 54 formed at an equidistance therebetween, for supporting both ends of the module IC. The insertion groove 54 also has the receiving spaces 55 at both sides thereof.

The housing 52 has a plurality of fastening holes 52a formed at both right and left sides thereof, and to which fixing screws 56 are selectively screwed through the through-holes 53a formed in the installation elements 53, so that a distance between the parallel installation elements 53 may be adjusted depending on a longitudinal width L of the module IC 1. Each receiving space 55 is adapted to receive a supporting member 57 therein some portion of which is normally narrower than other portions thereof, and become elastically wider when used to hold both sides of the module IC.

The supporting member 57, as shown in FIGS. 14 to 16b, consists of: a supporting portion 58 having a neck portion 57a which is used to hold both sides of the module IC 1, the portion 57a having a spacing S narrower than the thickness T of the module IC; and a bended portion 59 horizontally bended, for being horizontally slid in the receiving space when the module IC is inserted/pulled out to/from the inside thereof. The insertion groove 54 communicating with the receiving space 55 is provided with the drop preventing groove 53b for supporting the neck portion 57a so that the supporting member 57 is not dropped from the installation element 53 when the supporting member 57 was equipped.

In installing the supporting member 57 into the installation element 53, the installation can be completed without dropping from the installation element 53, by maximally compressing the neck portion 57a of the supporting member 57, positioning the horizontally bended portion 59 in the receiving space 55 and then removing an external force from the supporting member 57, in consequence, the neck portion 57a returning to its initial state by the restoring force itself to be hitched in the drop preventing groove 53b. Namely, when the module IC 1 is loaded between the supporting portions 58 of the supporting member 57, tensile force is exhibited only at the neck portion 57a due to a narrower width of the neck than the thickness of the module IC 1, whereas when loading the module IC, only force for restoring the neck portion 57a to its initial state is effective. Thus, the supporting member 57 does not drop from the receiving space 55.

Figure 17:
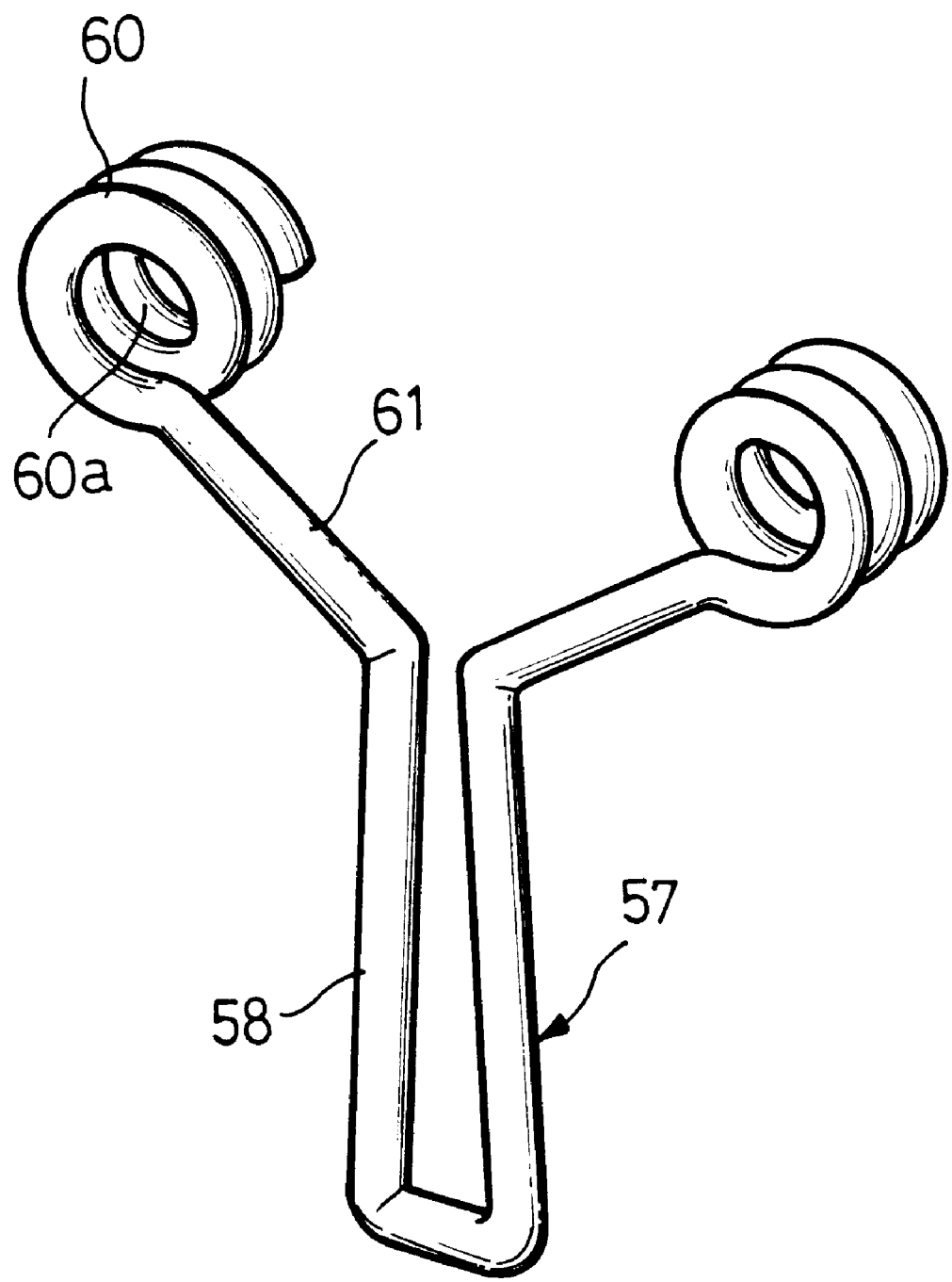
FIG. 17 is a perspective view showing another embodiment of the supporting member to which the present invention is applied.
Figure 18:
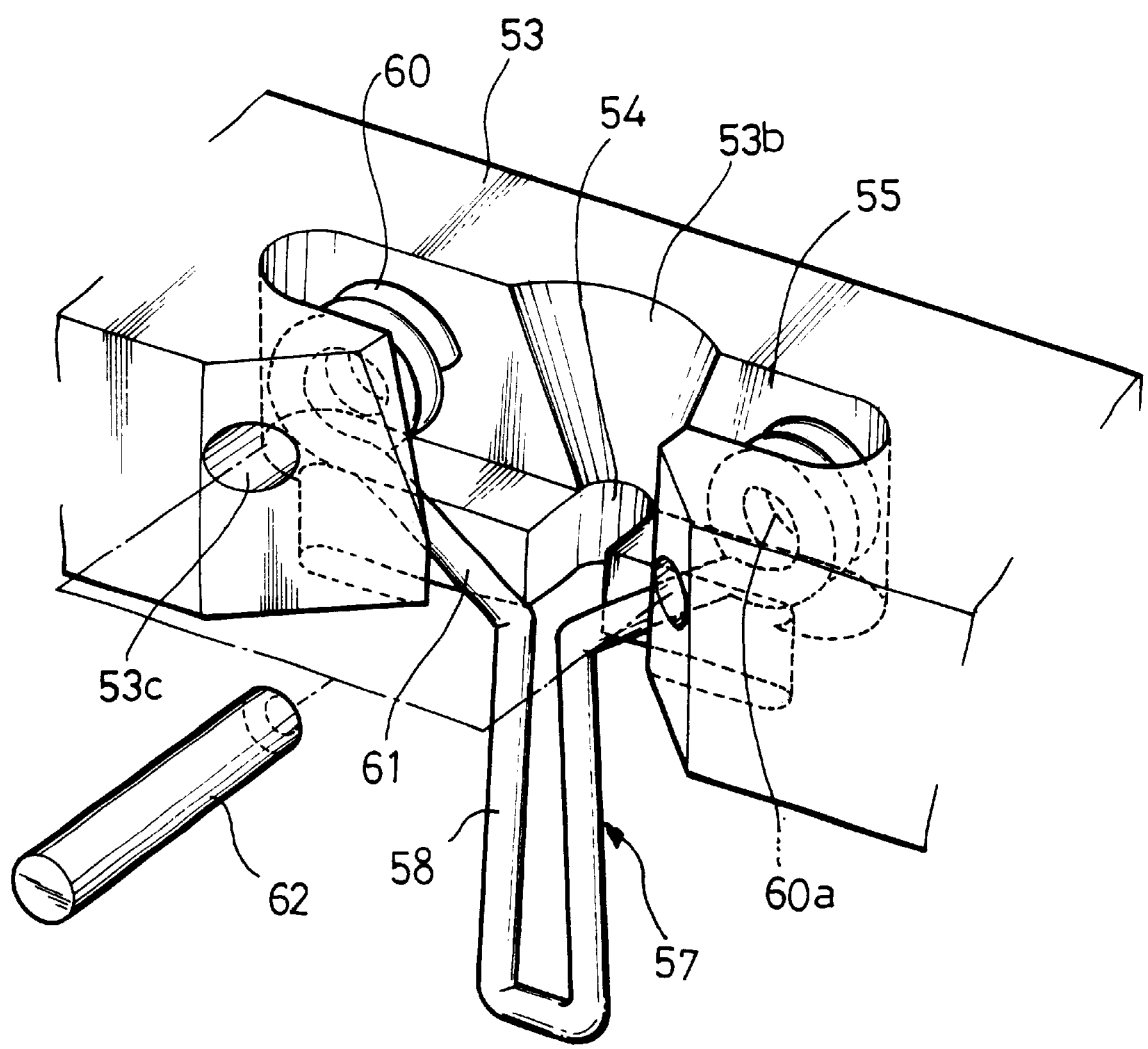
FIG. 18 is a perspective view showing main parts when the FIG. 17 supporting member is applied.

FIGS. 17 and 18 show another configurations of the supporting member. The supporting member 57 consists of: a supporting portion 58 for holding both sides of the module IC 1; a wound portion 60 having an insertion hole 60a therein used to install the supporting member 57 in the installation element 53; and a connecting portion 61 for connecting the wound portion 60 and the supporting portion 58. The coupling of the supporting member 57 into the installation element 53 can be accomplished by positioning the wound portions 60 in the receiving space 55 and inserting supporting pins 62 into the insertion holes 60a of the wound portion 50 through a is fixing hole 53c. The supporting member 57 may be implemented by a spring whose section is circular. This allows the drop preventing groove to be dispensable, because the supporting member 57 is fixed into the installation element 53 by means of the supporting pin 62. Since the connecting portion 61, as shown in FIG. 17, is tilted downward, this configuration also acts to guide the module IC to a passage between the supporting portions 58 when the module IC is loaded.

Figure 19A:
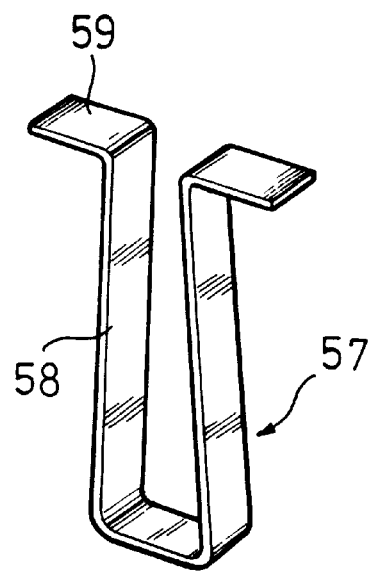
FIGS. 19a and 19b show the supporting member structured by a plate-spring.
Figure 19B:
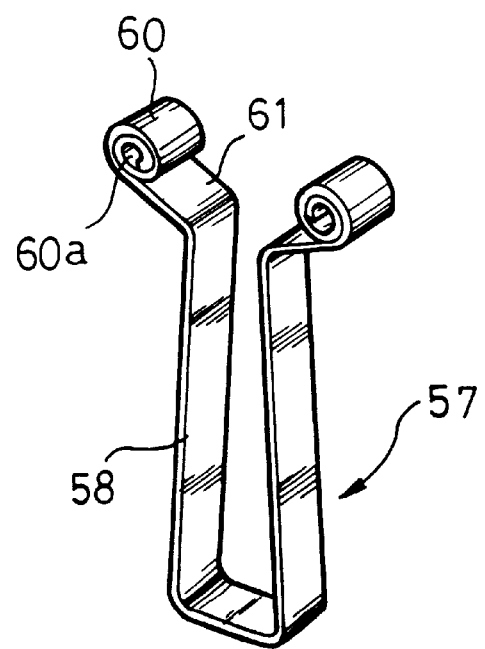

As shown in FIGS. 19a and 19b, a structure whose section is a plate, as a spring, may be applied to the supporting member 57. In case the plate configuration is applied for the supporting member 57, such a configuration, although it is relatively hard to produce it, increases in a contact area with both sides of the module IC 1, which guarantees, between the processes, the safe transferring of the loaded module IC in a carrier.

Figure 20:
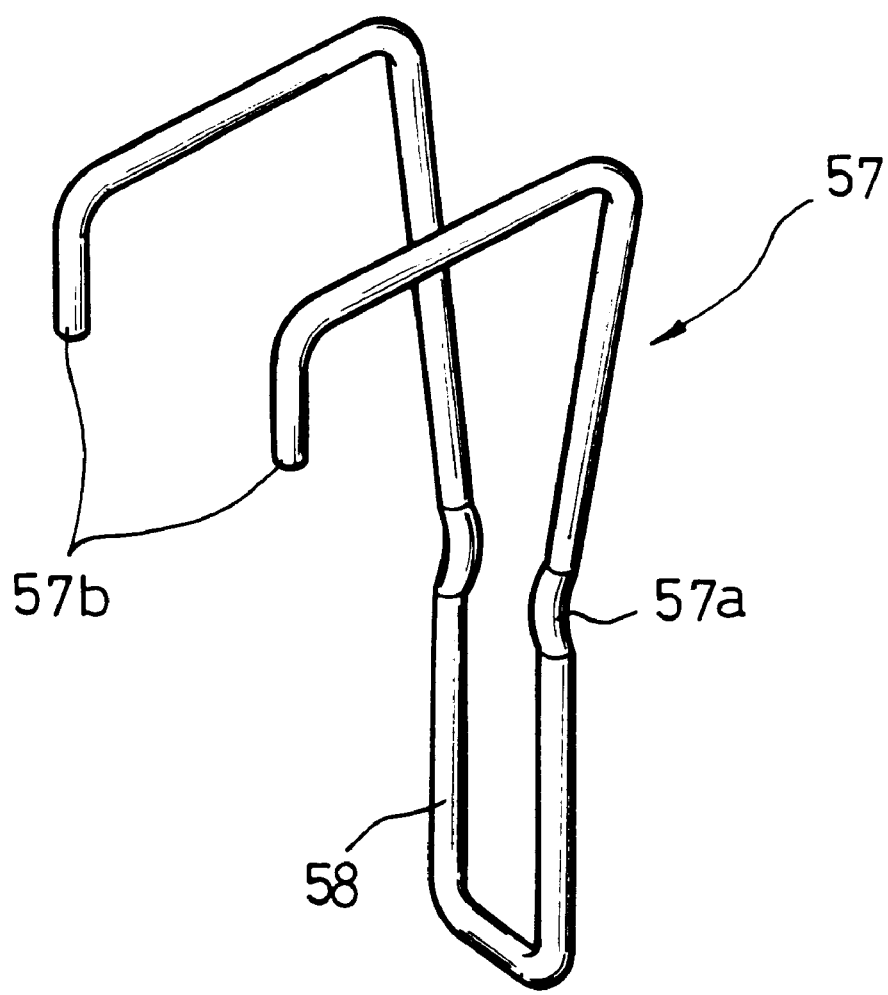
FIG. 20 is a perspective view showing another embodiment of the supporting member as a main part of the present invention.
Figure 21:
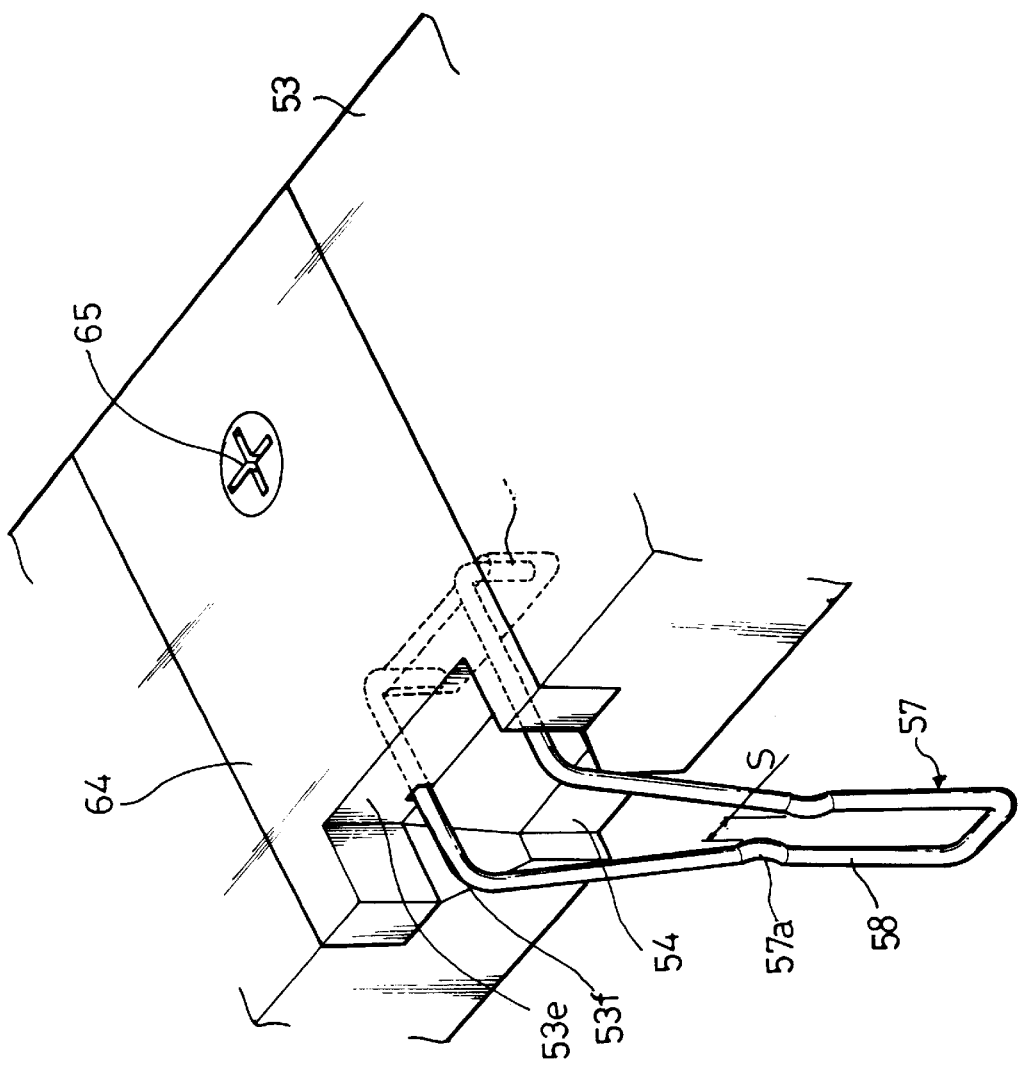
FIG. 21 is a perspective view showing main portions when the FIG. 20 supporting member is applied.

Further, the supporting member 57 may be configured as shown in FIGS. 20 and 21. There are provided the cut surfaces 53e in the installation element 53, the cut surfaces 53e being spaced apart at an equidistance therebetween and provided with long holes 53f. Further, since the supporting member 57 is inserted to the long hole 53f and then fixed by means of the bolt 65, the right and left floating of the supporting member 57 can be prevented. A supporting block 64 is used to fix the supporting member 57 to the installation element 53, the supporting member 57 being provided with a downward bended portion 57b for being inserted to the long hole 53f. Also, the supporting member 57 has a neck portion 57a provided with a protrusion inwardly projected, by which the spacing S of the neck portion is narrower than the thickness of the module IC 1.

The operation of the carrier for the module IC handler according to the third embodiment of the present invention will be described below.

Figure 14:
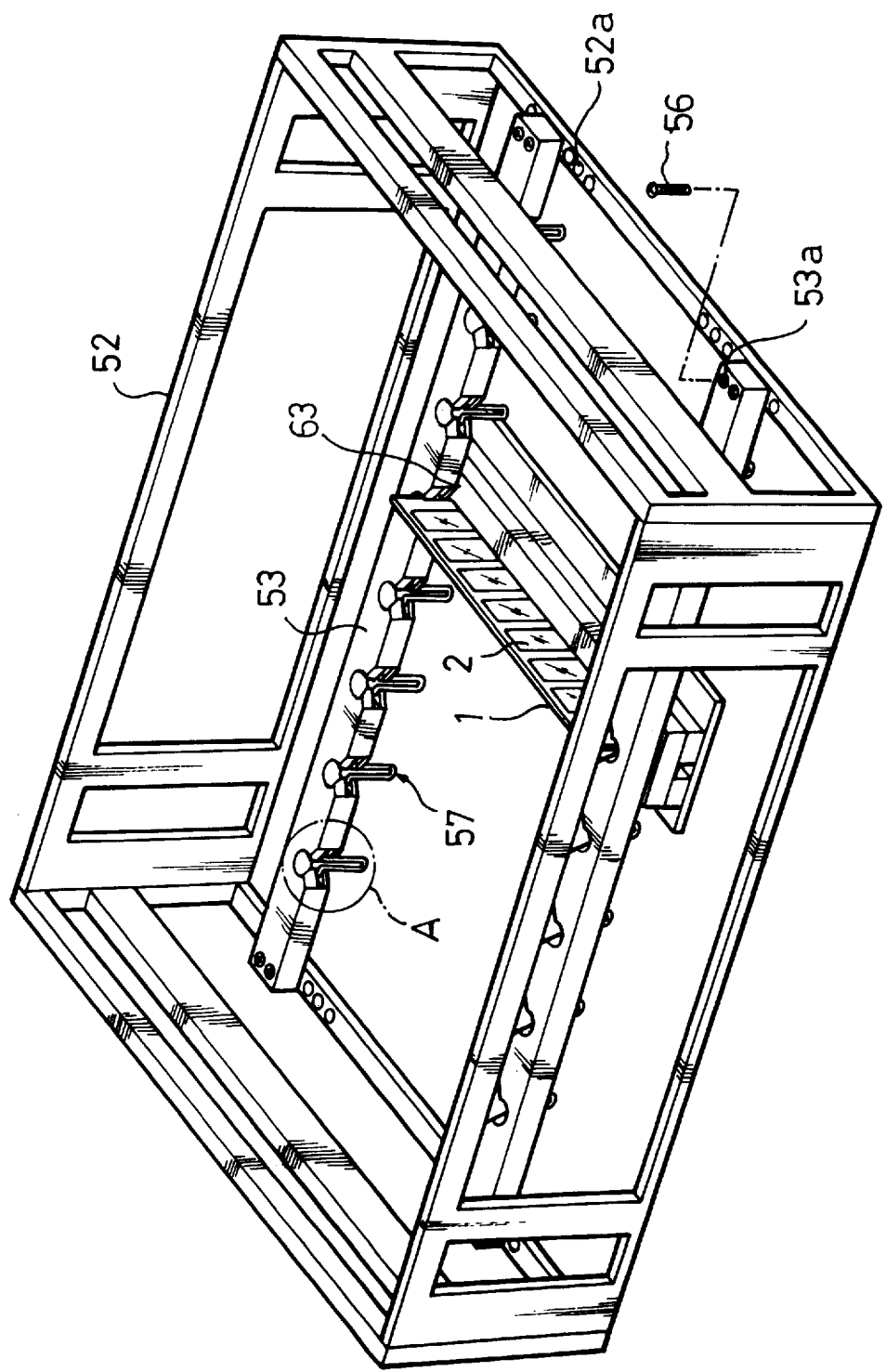
FIG. 14 illustrates a carrier for a module IC handler according to a third embodiment of the present invention.
Figure 15:
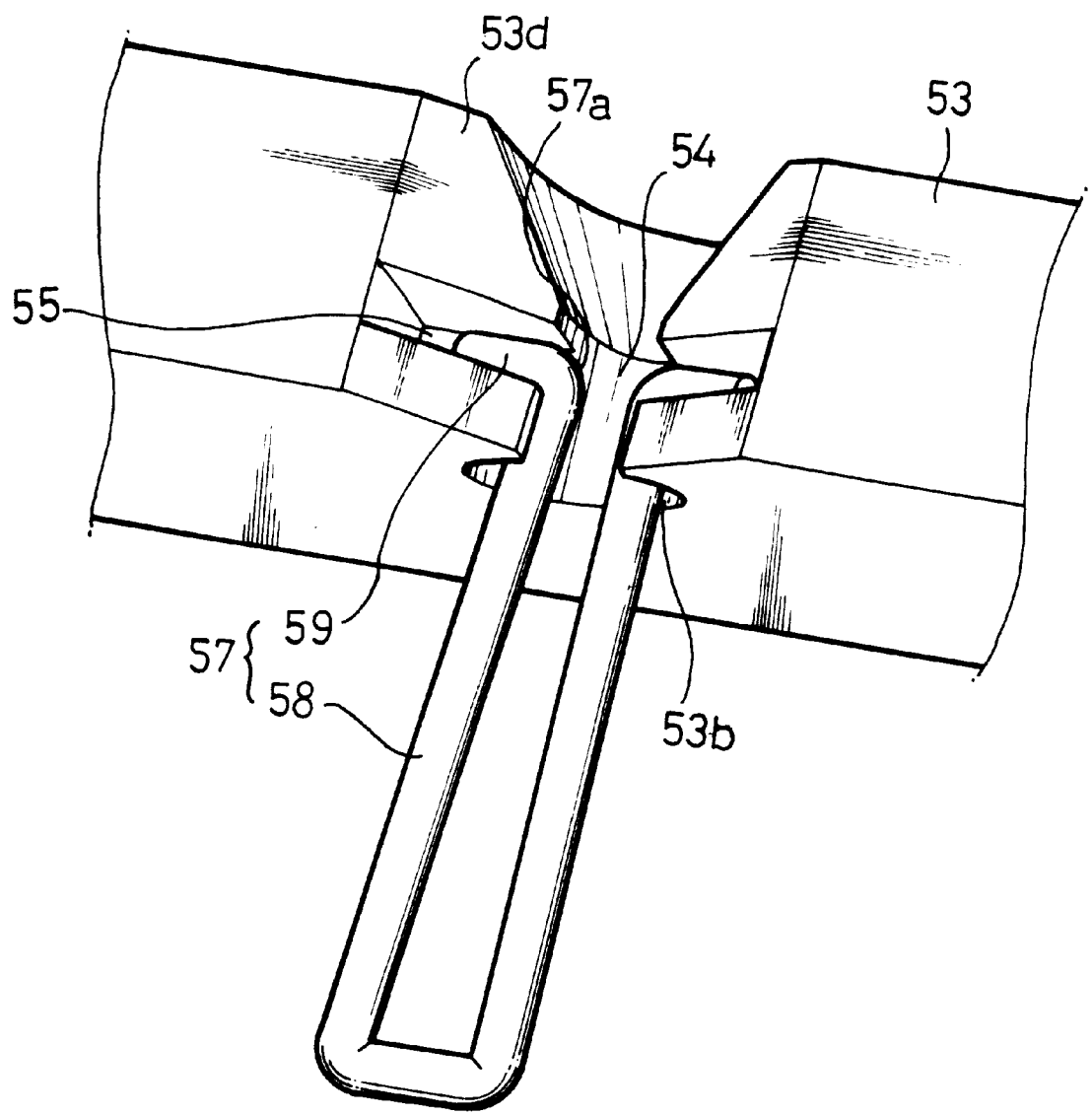
FIG. 15 is an enlarged bottom perspective view showing the portion "A" in FIG. 14.
Figure 16A:
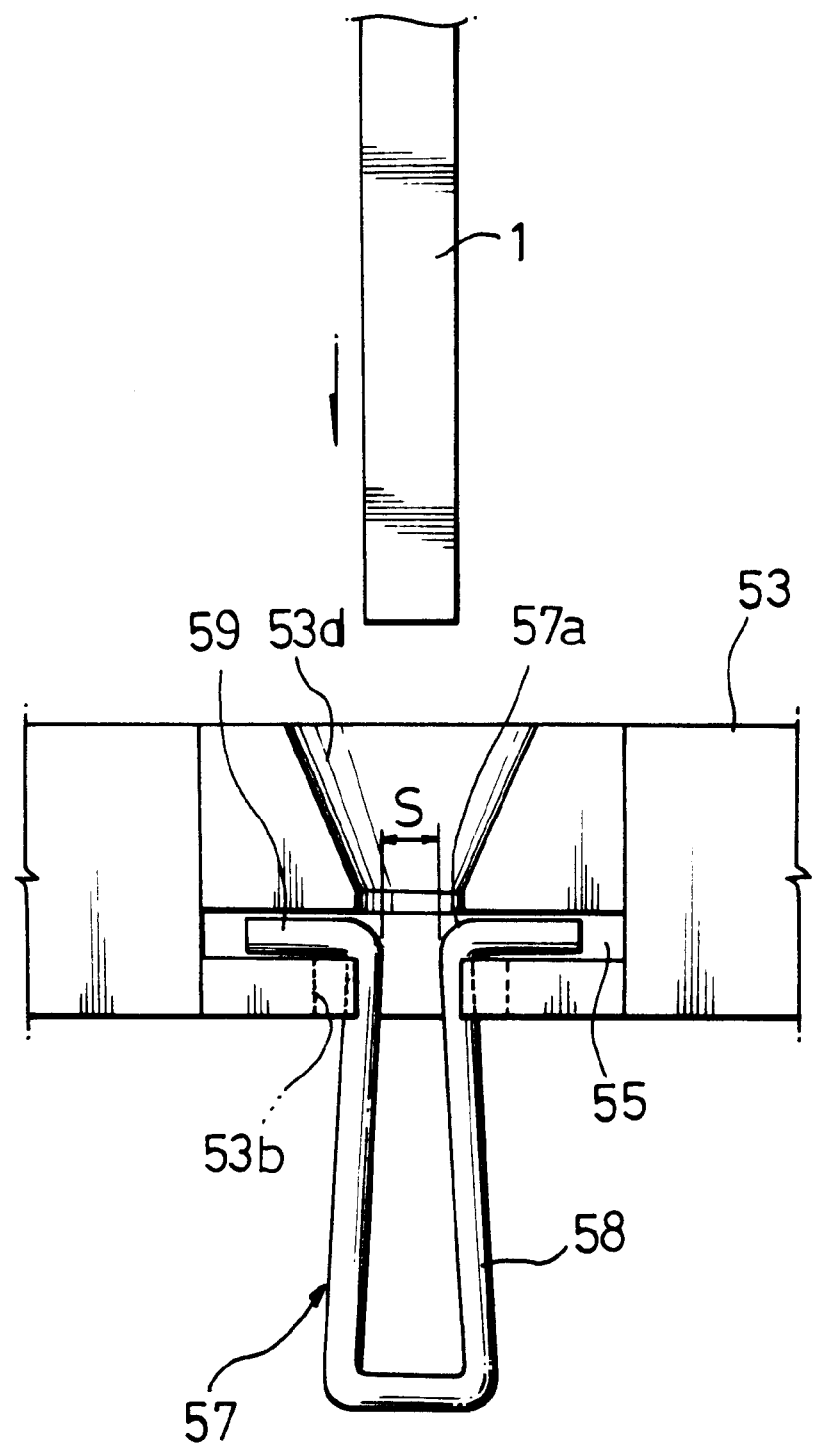
FIG. 16a is a view showing the state before the module IC held by the picking-up means is inserted.

As shown in FIG. 14, under the condition that the horizontal bended portion 59 of the supporting member 57 is positioned in the receiving space 55 of the installation element 53, the dropping of supporting member 57 from the installation element 53 is prevented because the neck portion 57a of the supporting member 57 is hitched in the drop preventing groove 53b. At this time, when the carrier arrives at the loading position of the module IC 1, separate picking-up means holds the module ICs contained in the tray and transfers them to a position over the carrier. After the plural module ICs 1 held by the picking-up means are transferred to a position over the insertion groove 54 formed in the installation element 53, as shown in FIG. 16a, and the transferring operation of the picking-up means stops.

Figure 16B:
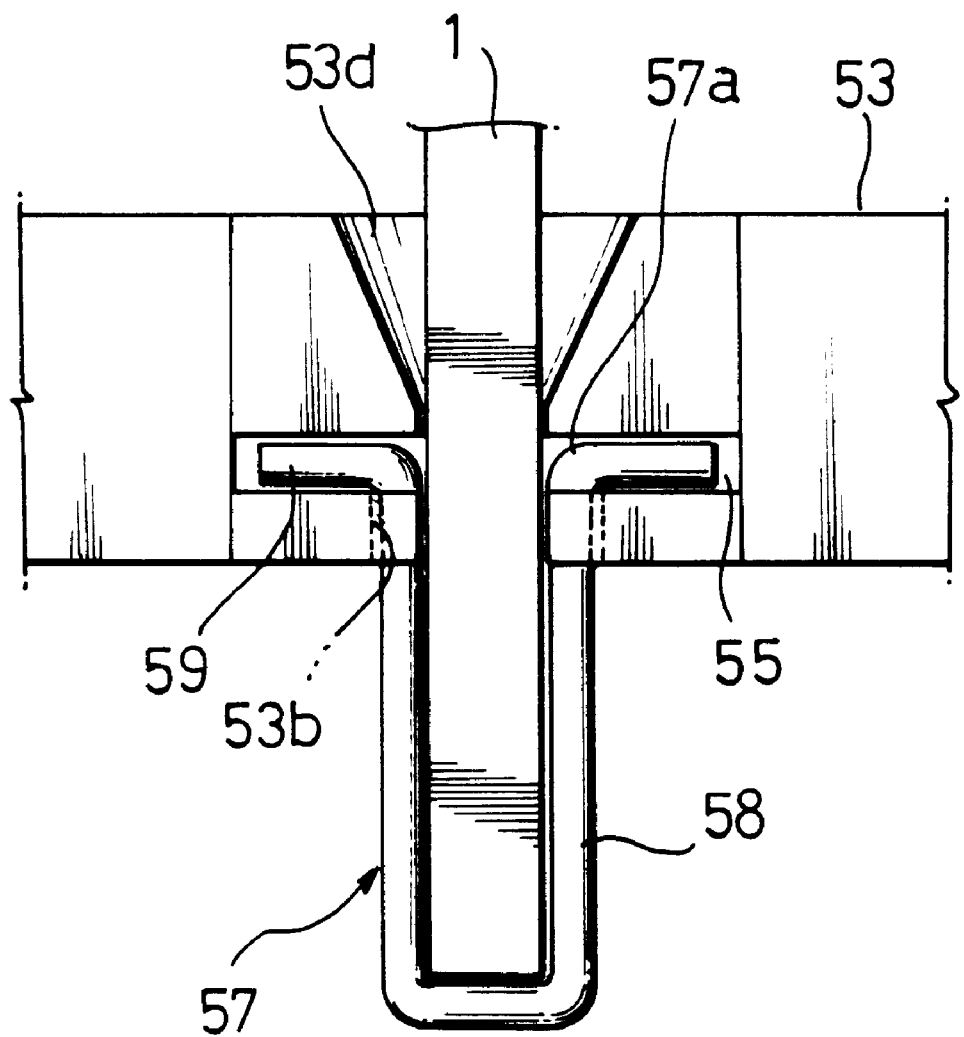
FIG. 16b is a view showing the state that by inserting the module IC, the supporting member is opened wide to hold both side surfaces of the module IC therebetween.

If the picking-up means lowers by separate driving means, the positioning of the module IC 1 held by the picking-up means is re-determined by the slant surface 53d formed in the installation element 53, and then both ends of the module IC are inserted in the insertion grooves 54, respectively. As the insertion of both ends of the module IC 1 into a region between the supporting portions 58 by way of the insertion hole 54 starts, the neck portion 57a becomes wider, as shown in FIG. 16b, due to narrower spacing S of the neck portion 57a relative to the thickness T of the module IC. Thus, the neck portion closely supports both sides of the module IC 1. As the neck portion 57a becomes wider, the horizontal bended portions 49 are opened along the receiving space 55. It is noted that while the configuration of supporting member 57 is such that a uniform opening of both ends thereof is obtained, in some cases, there may be the case where one end of the horizontal bended portion 59 is fixed not to be floated, whereas only the other end thereof is opened.

The module IC 1 is inserted between the supporting portions 59 of the supporting member 57 before the holding state of the picking-up means is released. After released, the picking-up means is elevated and moved toward the tray to hold new module IC. However, although released, since both sides of the module IC 1 are closely supported to the neck portion 57*a* of the supporting member 57, and further both ends of the module IC are positioned inside the insertion groove 54 of the installation element 53, the module IC is not dropped from the supporting member 17, when the carrier is transferred, or during the tests.

With the repetition of such operations, if all module ICs 1 are loaded into the supporting portion 58 of the supporting member 57, the carrier is transferred to the inside of the sealed chamber (not shown) by the transferring means, where the module ICs are heated at a temperature selected for the tests (e.g., about 70 to 90-degrees) and then transferred to the test site for the thermal resistance tests. At the time of the tests for the loaded module IC 1 in the carrier at the test site, the contacts can be made, with the horizontal or vertical positioning of the carrier being determined, based upon the installation direction of the test socket. In this case, since separate pusher presses the module IC 1 contained in the housing 52 toward the test socket, the module IC 1 is not dropped from the supporting member 57, and after finishing the tests, separate discharging lever, which is equipped in the test socket, pulls out the module IC inserted in the test socket, so that it becomes possible to transfer the module IC to the subsequent process (unloading process).

If, at the test site, the tests are finished and the carrier is transferred to the unloading position, separate picking-up means disposed at the unloading unit is moved to this place, to hold the module IC held between the supporting members 57 and sorts by the test results and store them in the unloading tray. Thus, the thermal resistance tests for the module ICs are completed.

At the operation described above, the picking-up means elevates, together with the module IC 1 whose both ends are held by the ascending picking-up means, by which the module IC 1 can exit from the supporting member 57. As the module IC leaves the supporting member 57, the spacing S of the neck portion 57*a* becomes narrower, as shown in FIG. 16*a*, by the elasticity of the supporting member 57, thus allowing a new module IC 1 to be loaded into the supporting member 57.

While the forgoing illustrates and describes the operation of the carrier for module IC handler according to the third embodiment of the preset invention, it will be understood that another embodiments to the supporting member 57 are similarly operated as in the third embodiment, i.e., when loading the module IC 1, the neck portion 57*a* of the supporting member 57 opens wider to support both sides of the module IC, thereby enables, between the processes, the handling of the loaded module IC in the carrier.

By the operations described above, only one carrier of the present invention, which loads the plural module ICs and transfers between the processes, can be used for providing the handling of various kinds of module ICs through a spacing adjustment of the installation elements 53 in the housing 52, in consideration of the longitudinal width L of the module ICs to be tested. That is, according to the width L of the module IC to be tested, the selection of any suitable fastening hole 52*a* among the plurality of the fastening holes 52*a* is made such that the appropriate spacing between a pair of installation elements 53 is maintained, and the fixing screw 56 screws into the insertion hole 53*a* aligned with the selected fastening hole 52*a*.

Next, a fourth embodiment according to the present invention will be explained below.

As shown in FIGS. 22 to 25, the carrier for the module IC handler according to the fourth embodiment of the present invention is provided with a pair of supporting blocks 73 installed oppositely to each other at both sides of a housing 72, and having one side to which an installation element 75 is fixed, the installation element 75 having positioning grooves 74 disposed at an equidistance.

The housing 72, in which the pair of supporting block are installed, has left and right sides in which long holes 72*a* are formed, respectively, that are used to adjust the spacing between the parallel supporting blocks in consideration of the longitudinal width L of the module IC 1 to be handled. The adjustment is made by determining the position of the supporting blocks 73 through the long holes 72*a*, and selectively fastening a fixing screw 76 into a fastening hole 73*a*.

In the receiving space 73*b* of the supporting block 73 (see FIG. 23) is coupled an ascending/descending member 77 having a slant long hole 77*a* therein to which one end portion of a connection member 78 is inserted to be retractable in response to the ascending/descending motion of the member 77. Another end portion of the connection member 78 is positioned in the positioning groove 74 of the installation element 75 and another end portion of the connection member 78 is also provided to which the supporting member 79 is inserted, wherein the supporting member 79 has a seating groove 79*a* and a seating surface 79*b* for receiving the module IC.

In order to install an elastic member 80 between the installation element 75 and the connection member 78, a plurality of pins 81 are inserted into the installation element 75 and each one end thereof is supported by an E-ring 82 to be exposed external to each connection member 78. The elastic member 80 is inserted in an outer peripheral surface of the pin disposed between the installation element 75 and the connection member 78.

Figure 23:
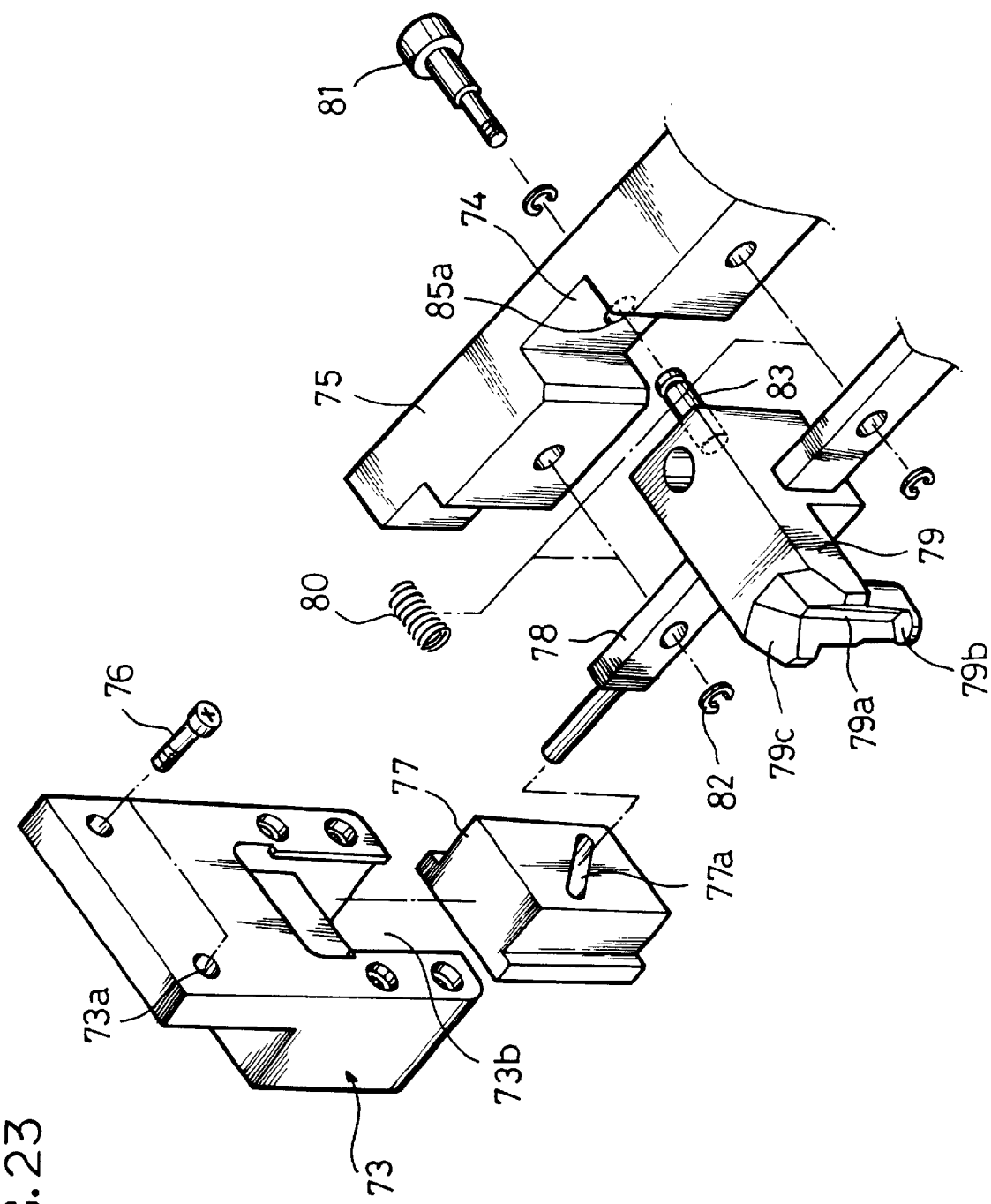
FIG. 23 is an exploded perspective view of the portion "A" in FIG. 22 as a main part of the present invention.
Figure 25:
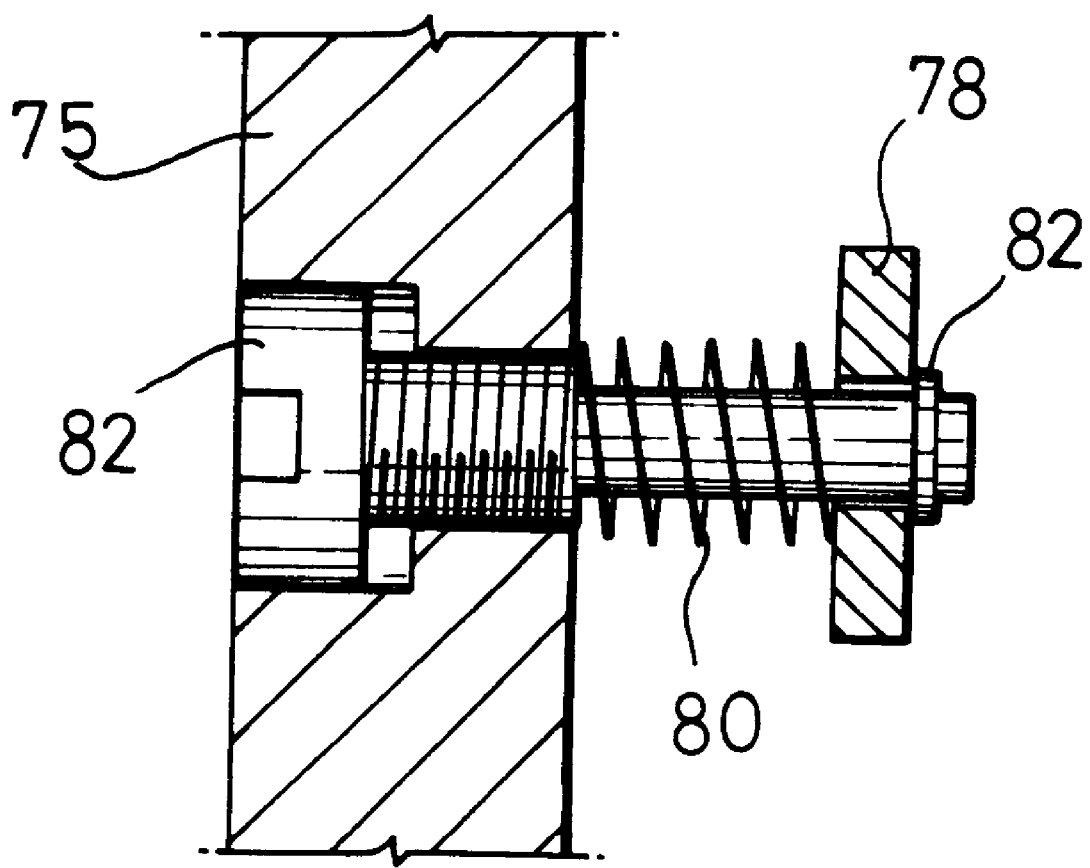
FIG. 25 is a vertical sectional view showing another embodiment in which the supporting member is installed in an installation element.

As shown in FIGS. 23 and 25, the coupling of the pin 81 into the installation element 75 is made by the screwing which allows the clamping force of the pin to be adjusted to vary an elastic force of the elastic member 80. To guarantee a safe inward or outward movement of the supporting member 79 inserted to the connection member 78, at least one or more guide pins 83 are fixed at one side of the supporting member 79, opposing to the side on which the seating groove 79*a* is formed. The guide pin 83 is fixed to the installation element 75 in which an insertion hole 85*a* receiving the guide pin 83 is formed.

The operation of the fourth embodiment according to the present invention will be explained below.

Figure 22:
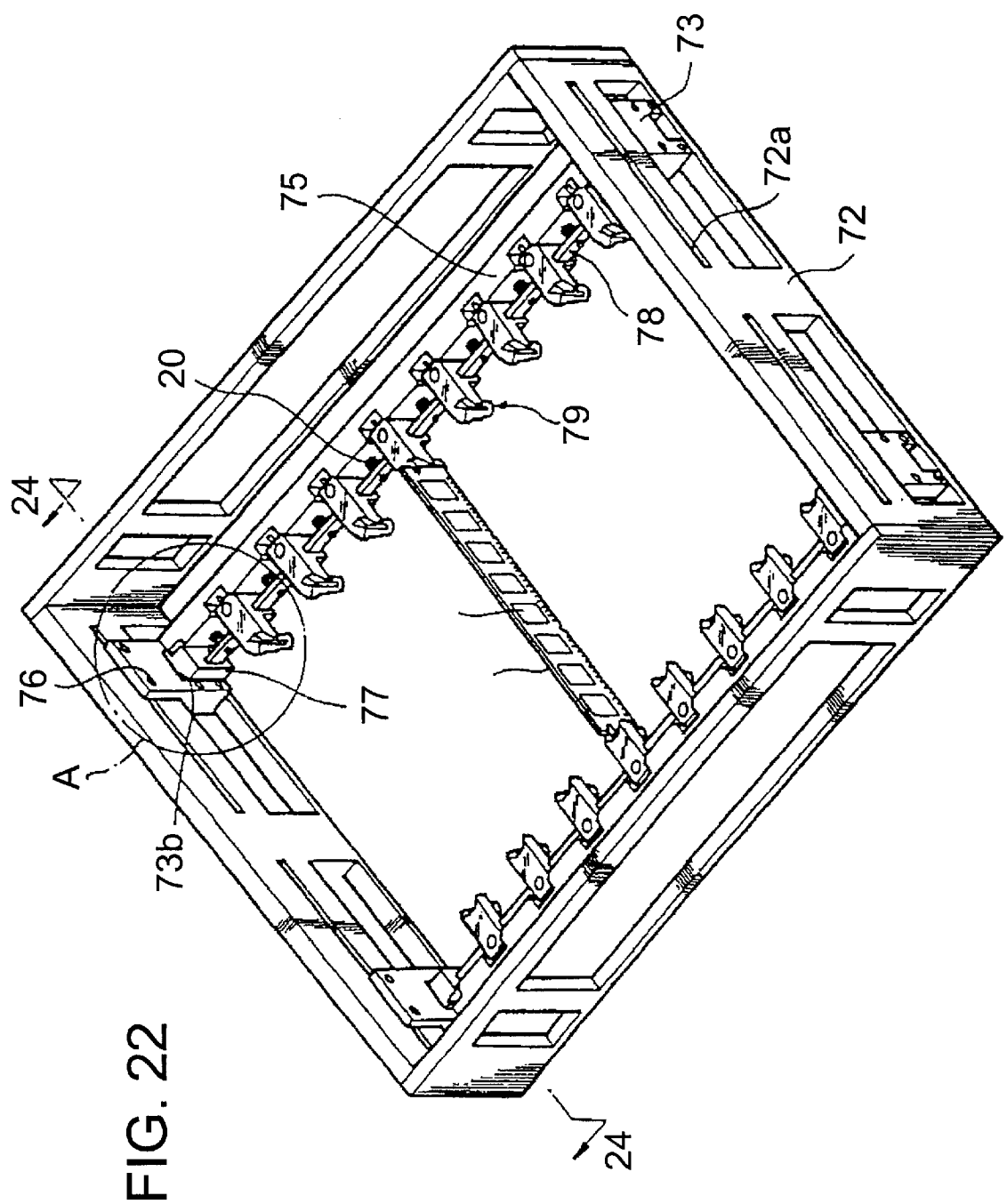
FIG. 22 illustrates a carrier for a module IC handler according to a fourth embodiment of the present invention.
Figure 24A:
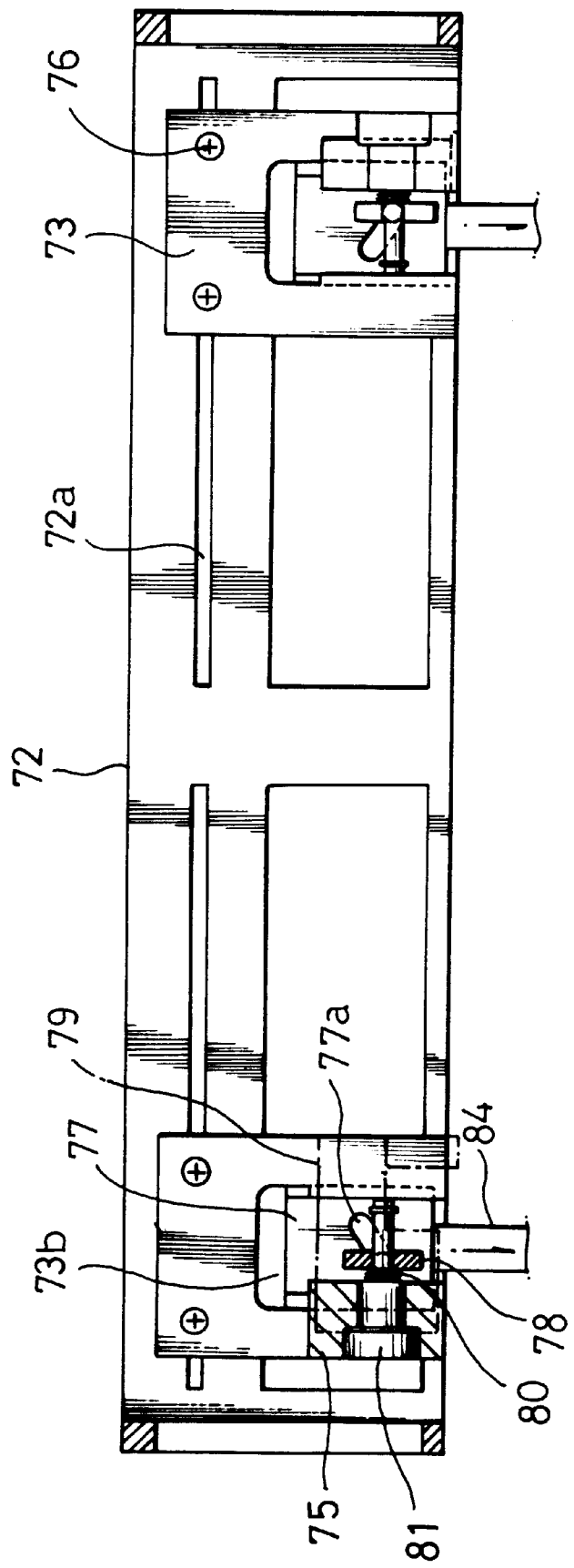
FIG. 24a is a view showing the state that the supporting member is opened wide according to the elevation of the ascending/descending member by a pusher.
Figure 24B:
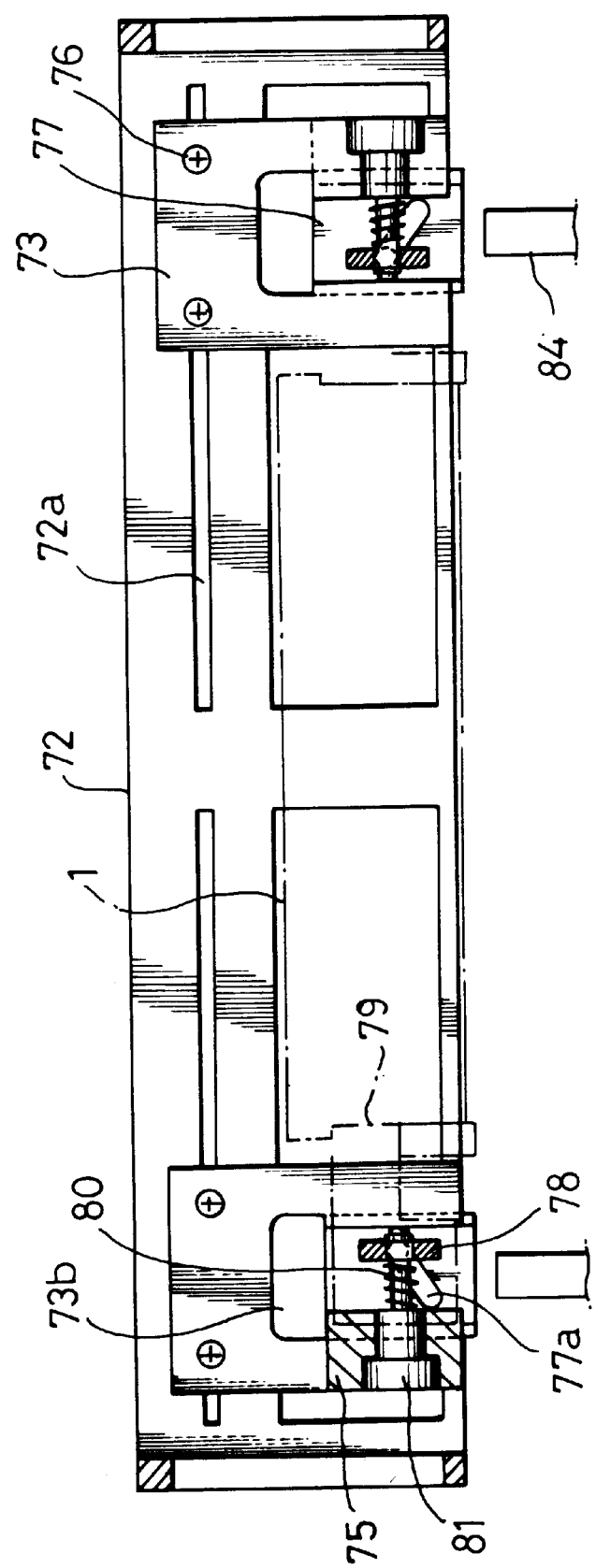
FIG. 24b is a view showing the state that both sides of the module IC are held by the supporting member by the restoring of the supporting member.

As shown in FIGS. 22 and 24*b*, when an external force is not applied to the ascending/descending member 7 installed in the supporting member 73, the member 77 is positioned at the bottom dead point by a restoring force of the elastic member 80 pushing the ascending/descending member 77. At this time, in case the carrier arrives at the loading position of the module IC 1, the elevating operation of the pusher 84 disposed at a lower portion of the carrier introduces an upward elevation of the member 77 installed at each supporting block 73.

Accordingly, due to the construction that the slant long hole 77*a* to which one end of the connection member 78 is inserted is formed in the ascending/descending member 77, as shown in FIG. 24a, a vertical motion of the ascending/descending member 77 is converted to a horizontal motion and transmitted to the connection member 78, so that the connection members 78 inserted to the plural supporting member 78 compresses the elastic member 80, causing the widening of spacing between the connection members 78.

After the spacing between the supporting members 79 installed oppositely to each other in the installation elements 75 becomes wider, then separate picking-up means hold the plurality of module ICs contained in the tray (not shown) to transfer them into the position over the carrier, and the transferring operation of the picking-up means is stopped when the plural module IC 1 held by the picking-up means is moved to a position over the seating groove 79a formed in the supporting member 79.

Thereafter, if the picking-up means lowers by separate driving means, the positioning of the module IC 1 held by the picking-up means is re-determined by a slant surface 79c formed in the supporting member 79, and then both ends of the module IC are inserted in each seating grooves 79a to abut against the bottom surface thereof.

After re-positioning the module IC 1 held by the picking-up means within the seating groove 79a of the supporting member 79, the holding state for the module IC is released, and for the purpose of holding new module ICs contained in the tray, following the movement of picking-up means toward the tray to hold the module ICs, the loading of the module IC 1 into a position between the supporting members 79 which the module IC is not present is conducted. Such operations are repeated. With the repetition of such operations, if all module ICs 1 are loaded to the supporting member 77 of the carrier, the pusher 84 having elevated the ascending/descending member 77 descends.

If the ascending/descending member 77 descends as the pusher 84 descends, the connection members 78 are inwardly moved to each other due to the construction that the slant long hole 77a to which one end of the connection member 78 is inserted is formed in the ascending/descending member 77. At this time, the inward movements of the connection members 78 are promptly made by aid of the restoring force of the elastic member 80 having been compressed between the installation elements 75, thereby the supporting members 79 holding both ends of the module IC 1.

With such operations, if all module ICs 1 to be tested are loaded and held by the supporting member 79, the carrier is transferred to the inside of the sealed chamber (not shown) by the transferring means, where the module ICs are heated at a temperature selected for the tests (e.g., about 70 to 90-degrees) and then transferred to the test site for the thermal resistance tests. It will be understood that the contacts can be made, with the horizontal or vertical positioning of the carrier being determined based upon the installation direction of the test socket. In this case, since separate pusher (not shown) presses the module IC 1 contained in the housing 72 toward the test socket, the carrier is moved to a test socket by the pressing force of the pusher, and after finishing the tests, separate discharging lever, which is equipped in the test socket, pulls out the module IC inserted in the test socket, so that it becomes possible to transfer the module IC to the subsequent process.

If, at the test site, the tests are finished and the carrier is transferred to the unloading position, separate picking-up means disposed at the unloading unit is moved to this place, to hold the module IC held between the supporting members 79 and sorts by the tests results and store them in the unloading tray. Thus, the thermal resistance tests for the module ICs are completed.

At the operation described above, the module IC 1 whose both ends are held by the supporting member 79 is released from the holding state thereof by the widening of the connection members 78 in which the supporting member 79 is inserted, during the elevation of the ascending/descending member 77 when the pusher installed at the unloading unit ascends. Thus, the unloading of the module IC becomes made possible.

Figure 26:
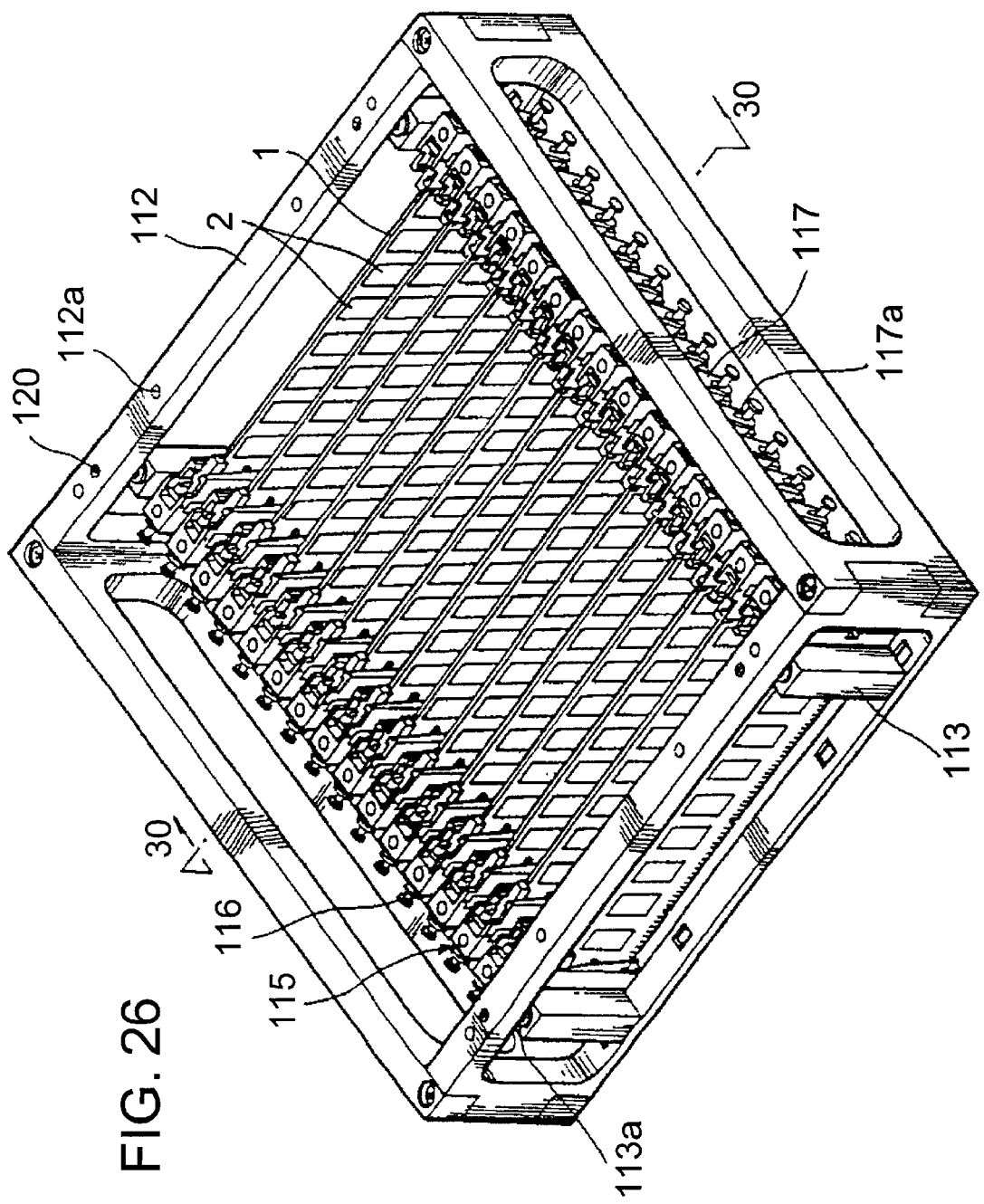
FIG. 26 illustrates a carrier for a module IC handler according to a fifth embodiment of the present invention.

Next, a fifth embodiment according to the present invention will be described below, with reference to FIGS. 26 and 29.

As shown in FIGS. 26 to 29, the carrier for the module IC handler is provided with a housing 112 configured like a rectangular frame, having right and left sides in which supporting blocks 113 are disposed, respectively. Between the supporting blocks 113, there are fixed at least one or more guide bars 114 to which a plurality of opposing holding member 115 are inserted which holds both ends of the module IC 1 being loaded.

In case of the guide bar 114 having polygonal configuration in section thereof and into which the plurality of the guide bar 114 having holding member 115 are inserted, only one guide bar 114 between the supporting blocks 113 is sufficient, while in case of the guide bar 114 of a rod having a circular section, preferably, two guide bars 114 for each of upper and lower portion are installed so that the holding member 114 is not rotated with respect to the guide bars 114. Further, there are provided with spacing adjustment means for adjusting the spacing of the holding member in consideration of associated position of the module IC, i.e., the loading or the unloading position.

This needs because an insertion groove of the tray containing the module IC 1 to be tested and a test socket at test site are commonly sized to have a pitch of 15 mm and an insertion groove of the unloading tray containing the test-finished module IC 1 is sized to have a pitch of 11 mm. Namely, in consideration of different pitch dimensions for each picking-up means installed at the loading and unloading positions, respectively, the provision of such an spacing adjustment means is such that the loading or unloading operation of the module IC 1 ensures to be conducted depending on the site which the carrier is placed.

Figure 29:
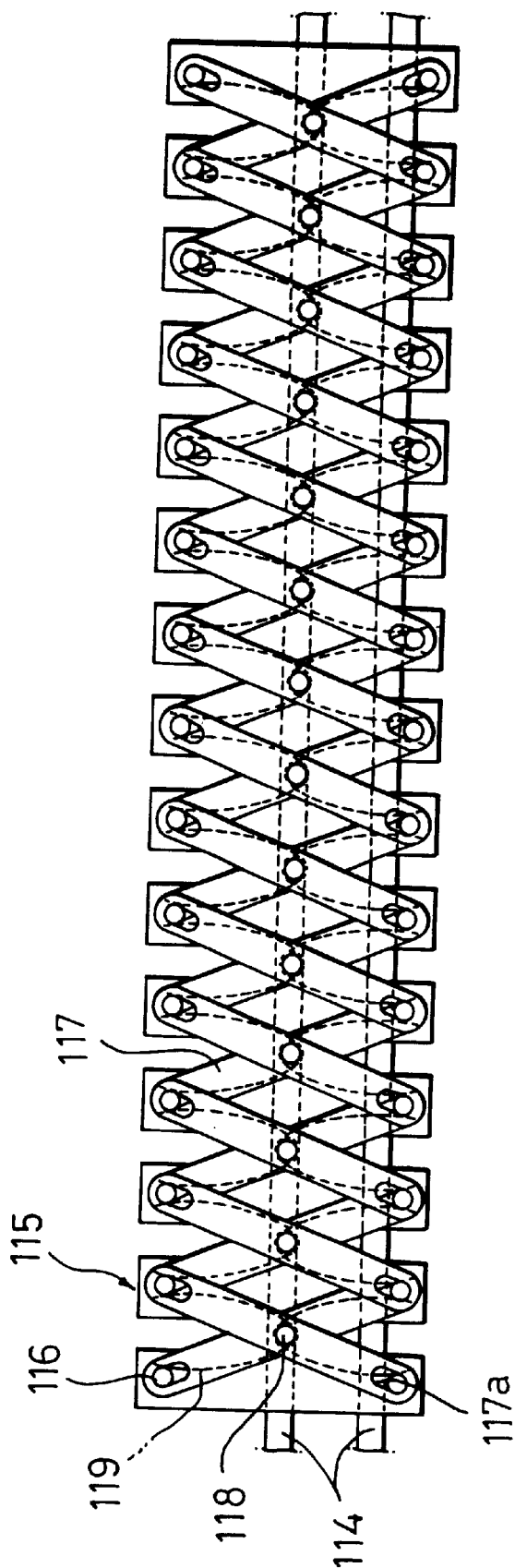
FIG. 29 is a view of spacing adjustment means as a main part of the present invention.

As shown in FIG. 29 illustrating a rear side of the spacing adjustment means, the spacing adjustment means comprises: a plurality of holding members 115 having a pair of upper and lower protrusions 116;

a plurality of links 117, ends of which have long holes 117a, for causing simultaneous moving of the holding members, wherein the link connects in a diagonal direction any one holding member 115 and another holding member adjacent to said one holding member by inserting the protrusion of each of holding members into the long holes of said link into; and elastic member 119 connected between a hinge axis of the link 117 and the protrusion 116 of the holding member 115, and used to maximize the spacing between the holding means 115 and the means 115 adjacent thereto by pushing outward each holding means, when an external force is applied. It is noted that while the elastic member 119 is embodied by a torsion spring according to the fifth embodiment of the present invention, any kinds of elastic member similar to it may be also used.

The housing is provided with a plurality of fastening holes 112a, and the supporting block 113 has an insertion hole 113a. Depending upon the longitudinal width L of the module IC 1 to be tested, the positioning of the supporting block 113 is determined and then the supporting block 113 is fixedly coupled by screwing a fixing screw 120 through the fastening hole 112a. Namely, in the case where the short width L of the module IC to be tested is given, the spacing of the supporting block is made narrower, thus allowing various lengths of the module ICs to be handled by only one carrier, irrelevantly of any lengths of the module IC.

Figure 27:
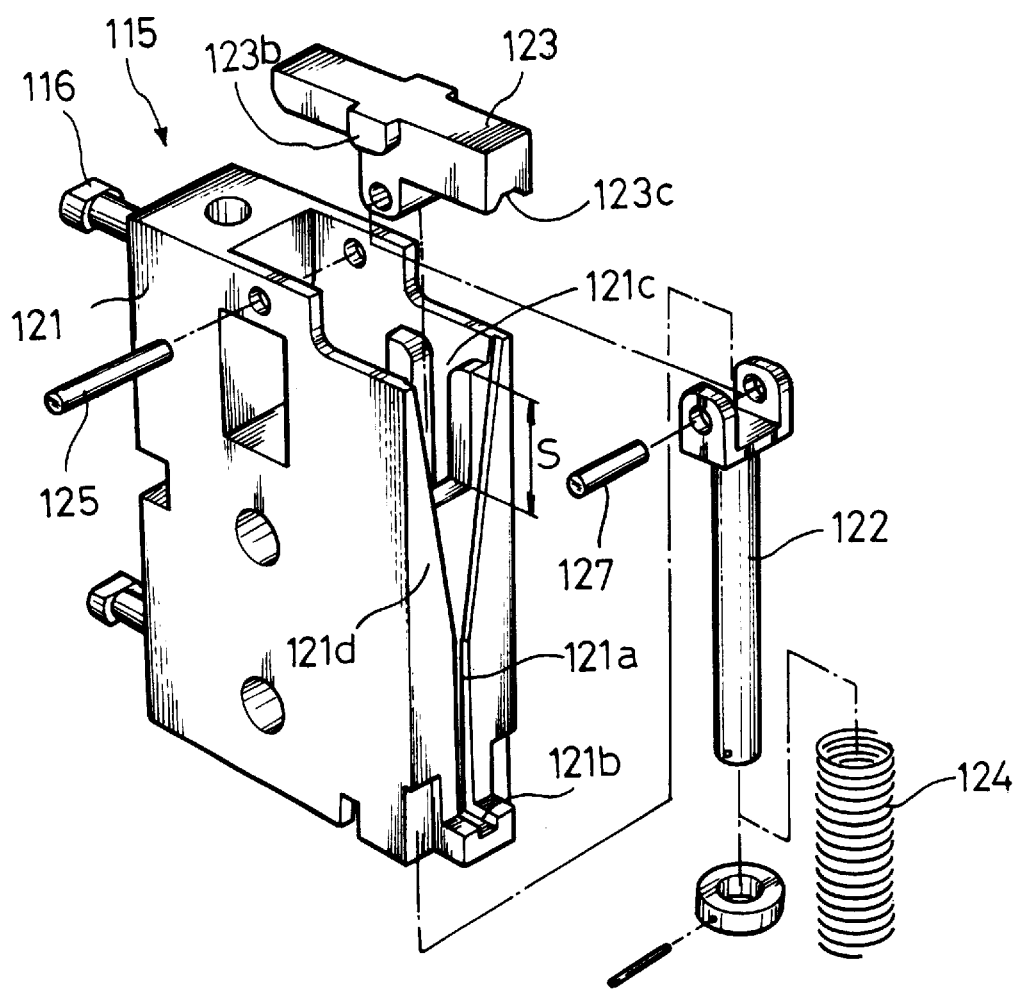
FIG. 27 is an exploded perspective view of a holding member as a main part of the present invention.
Figure 28:
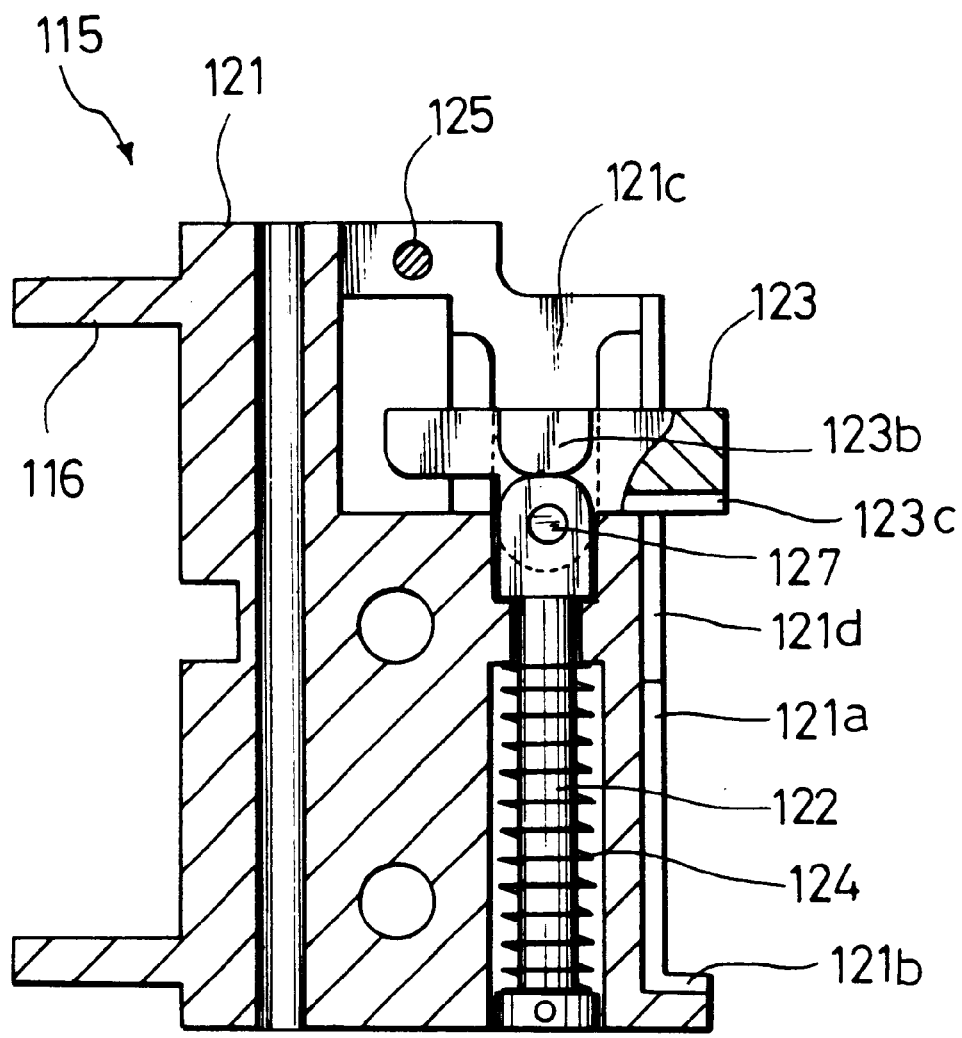
FIG. 28 is an exploded, vertical sectional view of the holding member shown in FIG. 27.

Further, as shown in FIGS. 27 and 28, the holding member 115, which is inserted to the guide bar 114 to hold both ends of the module IC 1, consists of:

- a body 121 having an insertion groove 121a, one side of which has a seating surface 121b and a seating surface 121b which are used to insert end portion of the module IC 1;
- an ascending/descending member 122 installed to the body to be moved upward/downward;
- a pressing piece 123 installed on an upper portion of the body to be rotated, and for pressing a top of the module IC 1;
- an elastic member 124 installed on an outer peripheral surface of the ascending/descending member 122, and for restoring the ascending/descending member 122 to which the pressing piece is installed, when an external force is not applied to the ascending/descending member 122; and
- a stopper 125 installed on the upper portion of the body 121, for rotating the pressing piece by suppressing the raising of the pressing piece.

Accordingly, since the pressing piece elastically installed by the elastic member 124 makes a horizontal motion within a horizontal motion range S, even when the module IC of different height T is to be tested, the module IC 1 higher than a minimal height of the module IC 1 can be handled without exchanging the parts.

The body 121 is further provided with a guide groove 121c into which a protrusion piece 123b formed at both sides of the pressing piece is inserted. When the ascending/descending member 122 is moved upward/downward, the pressing piece 123 makes a horizontal movement within the horizontal movement range S, at a condition that the pressing piece 123 is inserted into the guide groove 121c. At the horizontal movement beyond the range S, the pressing piece instead rotates by the operation that the rear end portion thereof is pressed by the stopper 125. By such rotation, a supporting groove 123c formed in a bottom surface of the pressing piece 123 encompasses the module IC 1 inserted into the insertion groove 121a. This ensures to safely maintain the holding state of the module IC 1 held by the holding member 115 during the transfer between the processes.

The operation of the carrier for the module IC handler according to the fifth embodiment of the present invention will be described.

Referring to FIG. 29, when an external force is not applied to the plurality of holding members 115 inserted into the guide bar 114, the maximum spaced distance, e.g., 15 mm, between the holding members 115 is maintained by the torsion spring. Further, as shown in FIG. 26, when an external force is not applied to the ascending/descending member 122 installed in the body 121, the ascending/descending member 122 is positioned at the bottom dead point by the restoring force of the elastic member 124, and the rotatable pressing piece 123 installed in the ascending/descending member 122 is positioned within the horizontal movement range.

Under such a condition, if the carrier arrives at the loading position for the module IC 1, the pushers 126, which are installed at a lower portion of the carrier (the numbers and installation positions of the pushers correspond to those of the holding members), elevate during which the ascending/descending member 122 installed in the body 121 is pushed upward.

Since the ascending/descending member 122 ascends and also compresses the elastic member 122, the rotatable pressing piece 123 installed in the ascending/descending member 122 is vertically moved up within the horizontal movement range, which stable vertical up movement of the pressing piece is guaranteed by the configuration that the protrusion 123b formed in the pressing piece 123 is inserted into the guide groove 121c formed in the housing 121.

Figure 30A:
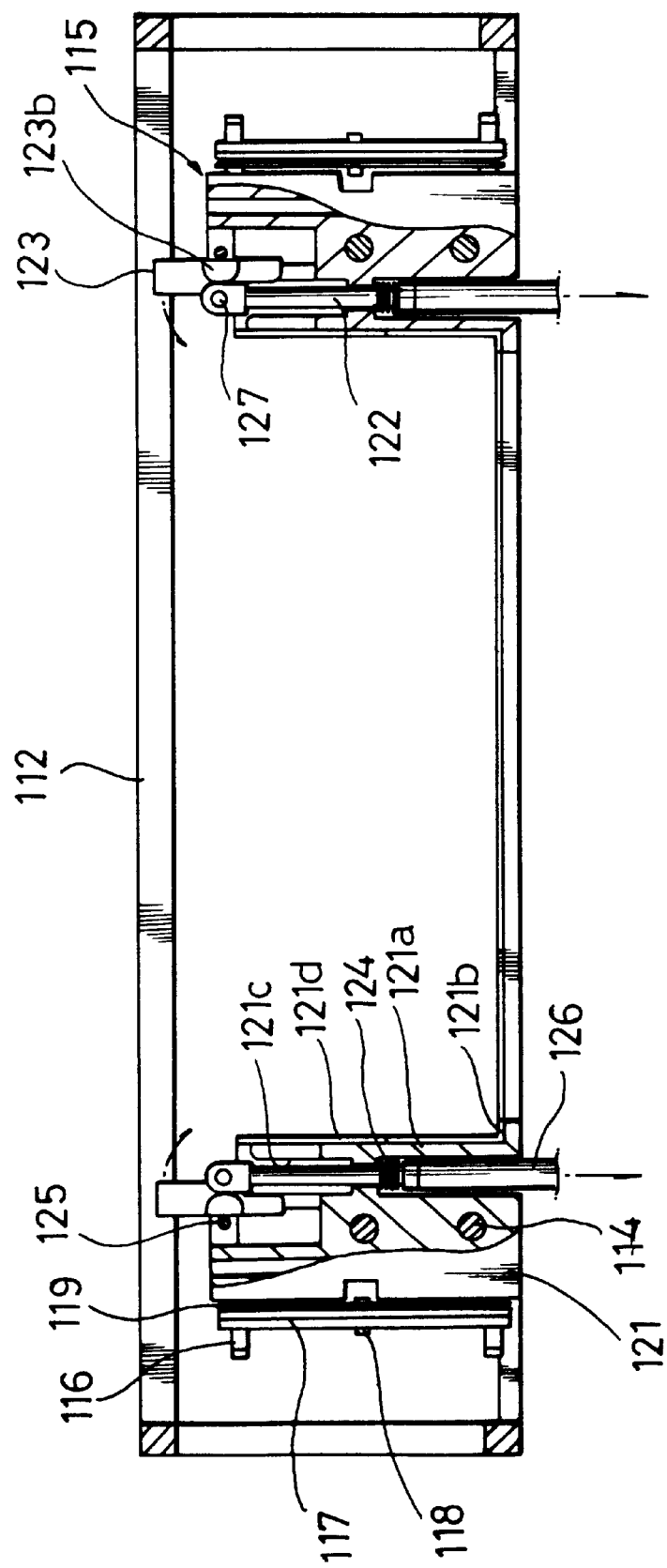
FIG. 30a is a view showing the state that a pressing piece is rotated by the elevation of the pusher.

With the continued up movement of the ascending/descending member 122, when the ascending/descending member 122 is further moved upward even at the condition that the rear end portion of the pressing piece 123 comes into contact with the stopper 125 beyond the horizontal movement range of the pressing piece 123, the pressing piece 123 no longer moves upward, instead, rotates with respect to an axis 127, as shown in FIG. 30a, so that the insertion groove 121a formed in the body 121 is opened.

The opposing pressing pieces 123 installed in the housing 112 are rotated in the opposing directions to each other to thereby open the insertion groove 121a, and thereafter, the loading side picking-up means holds the plurality of module ICs 1 contained with a spacing of 15 mm therebetween in the tray and transfers them to a position over the insertion groove 121a before the transferring operation of the picking-up means stops.

Then, if the picking-up means lowers by separate driving means, the positioning of the module IC 1 held by the picking-up means is re-determined by the slant surface 121d formed in the body 121, and then both ends of the module IC are inserted into each insertion groove 121a and the bottom surface of the module IC comes into contact with the seating surface 121b.

After the module IC 1 held by the picking-up means is positioned in the insertion groove 121a of the body 121, the holding state of the module IC 1 is released. The picking-up means then moved to the loading side tray holds new module IC 1 contained in the tray and loads the module IC into the body 121 in which no module IC is inserted. Such operations are repeated.

With such operations, if all module ICs 1 to be tested are loaded into the holding member 115, the pusher 124 having moved upward the ascending/descending member 122 descends. As the ascending/descending member 122 descends, the restoring force form the elastic member 119 compressed lowers the ascending/descending member 122, by which the pressing piece coupled to the ascending/descending member 122 by the axis 127 is pulled downward. Thus, the pressing piece 123, which was rotated by the rear end portion being hitched by the stopper, is rotated to be in a horizontal state at which the pressing piece 123 descends along the horizontal movement range S. During such horizontal movement, the pressing piece presses the top surface of the module IC 1, as shown in FIG. 30b.

With such operations, if all module ICs 1 to be tested are loaded and held by the holding member 115, the carrier is transferred to the inside of the sealed chamber (not shown) by the transferring means, where the module ICs are heated at a temperature selected for the tests (e.g., about 70 to 90-degrees) and then transferred to the test site for the thermal resistance tests. It will be understood that the contacts can be made, with the vertical or horizontal positioning of the carrier being determined based upon the installation direction of the test socket.

In this case, since separate pusher (not shown) presses the module IC 1 contained in the main body 112 toward the test socket, the carrier is moved to a test socket by the pressing force of the pusher, and after finishing the tests, separate discharging lever, which is equipped in the test socket, pulls out the module IC inserted in the test socket, so that it becomes possible to transfer the module IC to the subsequent process.

If, at the test site, the tests are finished and the carrier is transferred to the unloading position, the spacing of the holding member 115 inserted into the guide bar 114 should be adjusted to correspond to the insertion groove spacing, 11 mm of the unloading tray positioned at the unloading side.

After the carrier in which the test-finished module ICs 1 are contained is moved to the unloading position, the spacing of the holding member 115 which has been maintained with the spacing of 15 mm should be adjusted to the same spacing, 11 mm as the insertion groove of the unloading side unloading tray. Then, the plurality of picking-up means installed spaced apart at a spacing 11 mm therebetween can simultaneously hold and unload the plurality of module ICs from the holding member.

For this, separate pitch adjustment means holds respective body 121 at an upper or lower side to inwardly move it. At this time, the links 117 are folded which the long hole 117*a* is inserted into the protrusion 114 of the holding member 115, accompanying the compression of the elastic member 119 hitched between the protrusion 114 and a hinge axis 118. Thus, the spacing between the bodies 121 becomes narrower to a spacing of 11 mm which allows the picking-up means installed at the unloading side to hold the module IC 1.

After the spacing between the module ICs held by the holding member 115 is adjusted, separate pusher ascends, as in the loading operation of the module IC, to push the ascending/descending member 122. Then, the pressing piece connected to the ascending/descending member 122 is rotated by the rear end portion hitched by the stopper 125 to open the insertion groove 121*a*, but since further details thereof are the same as described above, further explanation therefor will be omitted.

Thus, the thermal resistance tests can be completed by holding the module IC inserted into the insertion groove 121*a* of the body 121 by using the picking-up means positioned at the unloading side, and sorting and putting the module ICs into the unloading tray depending upon the test results. The carrier according to the present invention which performs such operations described above and also loads the plurality of module ICs and transfers them between the processes, can handle various types of the module IC 1 by using one carrier through the spacing adjustment of the supporting block 113 based on the longitudinal width L of the module IC 1 to be tested. Namely, depending upon the longitudinal width L of the module IC 1 to be tested, the positioning of the supporting block 113 is determined and then the supporting block 113 is fixedly coupled by screwing a fixing screw 120 through the fastening hole 112*a* so as to maintain an appropriate spacing between a pair of supporting blocks 113.

As described above, the present invention improves reliability of the product by the tests which are performed after, at a temperature preset, heating the module IC transferred to the inside of the chamber, wherein the transferring of the module IC loaded in the carrier is easily achieved because the module IC is loaded into the carrier by the picking-up means, in an outside of the chamber.

Further, during the loading and unloading of the module IC into the carrier, the tests for the module ICs loaded in the carrier can be performed at the test site. Therefore, an advantage is provided that an extreme availability of a high-cost apparatus can be obtained.

What is claimed is:

1. A carrier for a module IC (Integrated Circuit) handler, comprising:
    a housing;
    a pair of installation elements installed parallel to each other in a receiving space of the housing;
    a plurality of rotators elastically installed in the installation elements, and configured to removedly receive and support module ICs by retractable actions thereof such that the module ICs can be readily mounted on and removed from the carrier; and
    a plurality of elastic members mounted in the installation elements such that each elastic member biases one of the plurality of rotators on one of the installation elements towards one of the plurality of rotators on the other of the installation elements.

2. The carrier as defined in claim 1, wherein the housing comprises a plurality of fastening holes configured to attach the installation elements to the housing, wherein the fastening holes are configured to allow the receiving space between the installation elements to be adjusted.

3. The carrier as defined in claim 1, further comprising a plurality of brackets with protruding rods, wherein each rotator is coupled to the corresponding bracket, and wherein the protruding rod of each bracket is inserted through the corresponding elastic member.

4. The carrier as defined in claim 3, further comprising a plurality of retaining devices, wherein each retaining device holds the corresponding bracket in one of the installation elements.

5. The carrier as defined in claim 4, wherein each retaining device comprises a retaining ring mounted in a groove of the protruding rod.

6. The carrier as defined in claim 1, wherein a V-groove is formed along a circumferential surface of each rotator.

7. The carrier as defined in claim 1, wherein each of the plurality of rotators is configured to abut and hold an edge of module ICs.

8. A carrier for a module IC (integrated circuit) handler comprising:
    a housing;
    a pair of installation elements installed parallel to each other in a receiving space of the housing;
    a plurality of holding devices mounted on each of the installation elements, wherein each of the holding devices is configured to hold an edge of a module IC; and
    a plurality of biasing devices, wherein each biasing device is configured to bias one of the holding devices on one of the installation elements towards one of the holding devices on the other of the installation elements.

9. The carrier of claim 8, wherein the housing and the installation elements are configured so that the installation elements can be mounted at different locations on the housing to vary the receiving space between the installation elements.

10. The carrier of claim 8, wherein each of the holding devices comprises a rotator, and wherein the rotator of each of the holding devices is configured to rotate as the module IC is inserted between a pair of the holding devices.

11. The carrier of claim 10, wherein a circumferential edge of each of said rotators is configured to abut and hold the edge of the module IC.

12. The carrier of claim 8, wherein the plurality of holding devices are configured to elastically hold the module ICs.

13. The carrier of claim 8, wherein each holding device comprises:
    a module IC interface portion configured to abut and hold the edge of the module IC; and
    a shaft connected to the module IC interface portion, wherein the shaft is slidably mounted on one of the installation elements.

14. The carrier of claim 13, wherein each of the biasing devices comprises a spring that biases the corresponding module IC interface portion towards a central portion of the housing.

15. The carrier of claim 14, wherein each of the biasing devices comprises a coil spring, and wherein the shaft of each holding device is inserted through the respective coil spring such that the respective coil spring biases the module IC interface portion of the corresponding holding device towards the central portion of the housing.

16. A carrier for a module IC (integrated circuit) handler, comprising:
    a housing;
    a pair of supporting blocks installed at both ends of the housing; and
    a pair of installation elements mounted on the supporting blocks, wherein each installation element has a plurality of holding members with positioning grooves, wherein the holding members on one of the installation elements are biased towards the corresponding holding members on the other installation element to elastically hold edges of module ICs.

17. The carrier of claim 16, wherein the supporting blocks and the installation elements are configured so that the installation elements can be mounted at a plurality of different positions on the supporting blocks to vary a spacing between the installation elements.

* * * * *